(12) United States Patent
Inoue et al.

(10) Patent No.: US 12,114,519 B2
(45) Date of Patent: Oct. 8, 2024

(54) LIGHT-EMITTING ELEMENT AND DISPLAY DEVICE

(71) Applicant: SHARP KABUSHIKI KAISHA, Sakai (JP)

(72) Inventors: Naoto Inoue, Sakai (JP); Chie Toridono, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 462 days.

(21) Appl. No.: 17/423,826

(22) PCT Filed: Feb. 21, 2019

(86) PCT No.: PCT/JP2019/006644
§ 371 (c)(1),
(2) Date: Jul. 16, 2021

(87) PCT Pub. No.: WO2020/170399
PCT Pub. Date: Aug. 27, 2020

(65) Prior Publication Data
US 2022/0115618 A1 Apr. 14, 2022

(51) Int. Cl.
*H10K 50/15* (2023.01)
*G09G 3/3275* (2016.01)
*H10K 50/16* (2023.01)

(52) U.S. Cl.
CPC .......... *H10K 50/15* (2023.02); *G09G 3/3275* (2013.01); *H10K 50/16* (2023.02); *G09G 2310/027* (2013.01)

(58) Field of Classification Search
CPC ....... H10K 50/15; H10K 50/16; G09G 3/3275
See application file for complete search history.

(56) References Cited

U.S. PATENT DOCUMENTS

| 2006/0290623 | A1 | 12/2006 | Okabe et al. |
| 2017/0256754 | A1* | 9/2017 | Defranco ............. H10K 59/353 |
| 2019/0296264 | A1* | 9/2019 | Mathai ................. H10K 50/852 |

FOREIGN PATENT DOCUMENTS

| JP | H4-308687 A | 10/1992 |
| JP | 2006-276097 A | 10/2006 |
| JP | 2007-005072 A | 1/2007 |
| JP | 2015-043009 A | 3/2015 |
| JP | 2015-043021 A | 3/2015 |

* cited by examiner

*Primary Examiner* — Jay C Kim
*Assistant Examiner* — Woo K Lee
(74) *Attorney, Agent, or Firm* — ScienBiziP, P.C.

(57) ABSTRACT

A light-emitting element includes a light-emitting layer, an upper electrode provided on a first side of the light-emitting layer, and a lower electrode provided on a second side of the light-emitting layer opposite to the first side. The lower electrode is constituted by a first electrode and a second electrode including a first gap therebetween, the second electrode having an area larger than that of the first electrode. The upper electrode is constituted by a third electrode and a fourth electrode including a second gap therebetween, the third electrode facing the first electrode and the second electrode, the fourth electrode facing the second electrode and having an area smaller than that of the third electrode.

22 Claims, 17 Drawing Sheets

(a)
(i) LIGHTING MODE 1  6/8 LIT

| REGION | L1 | L2 | L3 | L4 |
|---|---|---|---|---|
| POLARITY (6A, 6B) | + | + | + | − |
| POLARITY (6C, 6D) | − | + | + | + |
| ELECTRICAL FIELD ORIENTATION | ↓ | NONE | NONE | ↑ |
| LIT/UNLIT | ON | OFF | OFF | ON |

(b)
(ii) LIGHTING MODE 2  4/8 LIT

| REGION | L1 | L2 | L3 | L4 |
|---|---|---|---|---|
| POLARITY (6A, 6B) | + | + | + | + |
| POLARITY (6C, 6D) | − | − | − | − |
| ELECTRICAL FIELD ORIENTATION | ↓ | ↓ | ↓ | ↓ |
| LIT/UNLIT | ON | ON | OFF | OFF |

(ii) LIGHTING MODE 2  4/8 LIT

| REGION | L1 | L2 | L3 | L4 |
|---|---|---|---|---|
| POLARITY (6A, 6B) | − | − | − | − |
| POLARITY (6C, 6D) | + | + | + | + |
| ELECTRICAL FIELD ORIENTATION | ↑ | ↑ | ↑ | ↑ |
| LIT/UNLIT | OFF | OFF | ON | ON |

(c)
(iii) LIGHTING MODE 3  3/8 LIT

| REGION | L1 | L2 | L3 | L4 |
|---|---|---|---|---|
| POLARITY (6A, 6B) | + | + | + | + |
| POLARITY (6C, 6D) | − | + | + | + |
| ELECTRICAL FIELD ORIENTATION | ↓ | NONE | NONE | NONE |
| LIT/UNLIT | ON | OFF | OFF | OFF |

(iii) LIGHTING MODE 3  3/8 LIT

| REGION | L1 | L2 | L3 | L4 |
|---|---|---|---|---|
| POLARITY (6A, 6B) | + | + | + | − |
| POLARITY (6C, 6D) | + | + | + | + |
| ELECTRICAL FIELD ORIENTATION | NONE | NONE | NONE | ↑ |
| LIT/UNLIT | OFF | OFF | OFF | ON |

(d)
(iv) LIGHTING MODE 4  1/8 LIT

| REGION | L1 | L2 | L3 | L4 |
|---|---|---|---|---|
| POLARITY (6A, 6B) | + | + | + | − |
| POLARITY (6C, 6D) | + | − | − | − |
| ELECTRICAL FIELD ORIENTATION | NONE | ↓ | ↓ | NONE |
| LIT/UNLIT | OFF | ON | OFF | OFF |

(iv) LIGHTING MODE 4  1/8 LIT

| REGION | L1 | L2 | L3 | L4 |
|---|---|---|---|---|
| POLARITY (6A, 6B) | − | − | − | + |
| POLARITY (6C, 6D) | − | + | + | + |
| ELECTRICAL FIELD ORIENTATION | NONE | ↑ | ↑ | NONE |
| LIT/UNLIT | OFF | OFF | ON | OFF |

(e)
(v) LIGHTING MODE 5  0/8 LIT

| REGION | L1 | L2 | L3 | L4 |
|---|---|---|---|---|
| POLARITY (6A, 6B) | + | + | + | + |
| POLARITY (6C, 6D) | + | + | + | + |
| ELECTRICAL FIELD ORIENTATION | NONE | NONE | NONE | NONE |
| LIT/UNLIT | OFF | OFF | OFF | OFF |

(v) LIGHTING MODE 5  0/8 LIT

| REGION | L1 | L2 | L3 | L4 |
|---|---|---|---|---|
| POLARITY (6A, 6B) | − | − | − | − |
| POLARITY (6C, 6D) | − | − | − | − |
| ELECTRICAL FIELD ORIENTATION | NONE | NONE | NONE | NONE |
| LIT/UNLIT | OFF | OFF | OFF | OFF |

FIG. 7

(a) (i) LIGHTING MODE 1  13/16 LIT

| REGION | L1 | L2 | L3 | L4 |
|---|---|---|---|---|
| POLARITY (A, B) | + | + | + | − |
| POLARITY (C, D) | − | + | + | + |
| ELECTRICAL FIELD ORIENTATION | ↓ | NONE | NONE | ↑ |
| LIT/UNLIT | ON | OFF | OFF | ON |

(b) (ii) LIGHTING MODE 2  8/16 LIT

| REGION | L1 | L2 | L3 | L4 |
|---|---|---|---|---|
| POLARITY (A, B) | + | + | + | + |
| POLARITY (C, D) | − | − | − | − |
| ELECTRICAL FIELD ORIENTATION | ↓ | ↓ | ↓ | ↓ |
| LIT/UNLIT | ON | ON | OFF | OFF |

↔

(ii) LIGHTING MODE 2  8/16 LIT

| REGION | L1 | L2 | L3 | L4 |
|---|---|---|---|---|
| POLARITY (A, B) | − | − | − | − |
| POLARITY (C, D) | + | + | + | + |
| ELECTRICAL FIELD ORIENTATION | ↑ | ↑ | ↑ | ↑ |
| LIT/UNLIT | OFF | OFF | ON | ON |

(c) (iii) LIGHTING MODE 3  7/16 LIT

| REGION | L1 | L2 | L3 | L4 |
|---|---|---|---|---|
| POLARITY (A, B) | + | + | + | + |
| POLARITY (C, D) | − | + | + | + |
| ELECTRICAL FIELD ORIENTATION | ↓ | NONE | NONE | NONE |
| LIT/UNLIT | ON | OFF | OFF | OFF |

(d) (iv) LIGHTING MODE 4  6/16 LIT

| REGION | L1 | L2 | L3 | L4 |
|---|---|---|---|---|
| POLARITY (A, B) | + | + | + | − |
| POLARITY (C, D) | + | + | + | + |
| ELECTRICAL FIELD ORIENTATION | NONE | NONE | NONE | ↑ |
| LIT/UNLIT | OFF | OFF | OFF | ON |

(e) (v) LIGHTING MODE 5  2/16 LIT

| REGION | L1 | L2 | L3 | L4 |
|---|---|---|---|---|
| POLARITY (A, B) | − | − | − | + |
| POLARITY (C, D) | + | + | + | + |
| ELECTRICAL FIELD ORIENTATION | ↑ | ↑ | ↑ | NONE |
| LIT/UNLIT | OFF | OFF | ON | OFF |

(f) (vi) LIGHTING MODE 6  1/16 LIT

| REGION | L1 | L2 | L3 | L4 |
|---|---|---|---|---|
| POLARITY (A, B) | + | + | + | + |
| POLARITY (C, D) | + | − | − | − |
| ELECTRICAL FIELD ORIENTATION | NONE | ↓ | ↓ | NONE |
| LIT/UNLIT | OFF | ON | OFF | OFF |

(g) (vii) LIGHTING MODE 7  0/16 LIT

| REGION | L1 | L2 | L3 | L4 |
|---|---|---|---|---|
| POLARITY (A, B) | + | + | + | + |
| POLARITY (C, D) | + | + | + | + |
| ELECTRICAL FIELD ORIENTATION | NONE | NONE | NONE | NONE |
| LIT/UNLIT | OFF | OFF | OFF | OFF |

↔

(vii) LIGHTING MODE 7  0/16 LIT

| REGION | L1 | L2 | L3 | L4 |
|---|---|---|---|---|
| POLARITY (A, B) | − | − | − | − |
| POLARITY (C, D) | − | − | − | − |
| ELECTRICAL FIELD ORIENTATION | NONE | NONE | NONE | NONE |
| LIT/UNLIT | OFF | OFF | OFF | OFF |

FIG. 14

LIGHT-EMITTING ELEMENT AND DISPLAY DEVICE

TECHNICAL FIELD

The disclosure relates to a light-emitting element and a display device including the light-emitting element.

BACKGROUND ART

In recent years, various display devices including a light-emitting element have been developed. Particularly, a display device including an organic light-emitting diode (OLED) and a display device including an inorganic light-emitting diode or a quantum dot light-emitting diode (QLED) have drawn a great deal of attention because these devices offer advantages such as lower power consumption, smaller thickness, and higher picture quality.

On the other hand, OLEDs and QLEDs have a problem in having poor reproducibility in a low gray scale.

In particular, in QLEDs, there is a sharp change in brightness characteristics with respect to voltage, making it difficult to express brightness on the low gray scale side, and attempts have been made to introduce and improve time division driving.

CITATION LIST

Patent Literature

PTL 1: JP 2015-43021 A (published on Mar. 5, 2015)
PTL 2: JP 2015-43009 A (published on Mar. 5, 2015)
PTL 3: JP 2006-276097 A (published on Oct. 12, 2006)
PTL 4: JP H4-308687 A (published on Oct. 30, 1992)
PTL 5: JP 2007-5072 A (published on Jan. 11, 2007)

Summary

Technical Problem (a) of FIG. 17 and (b) of FIG. 17 are diagrams illustrating a degree of brightness variation in a display surface in each gray scale of a QLED display device in the related art having a time division driving system (pulse width modulation (PWM) driving in a time division direction). (a) of FIG. 17 and (b) of FIG. 17 show results obtained by measuring brightness variation characteristics in the display surface with respect to a certain input gray scale for two display devices of the same model.

As illustrated in (a) of FIG. 17 and (b) of FIG. 17, it is understood that, in each display device, the brightness variation in the display surface clearly significantly increases on the lower gray scale (32 gray scale) side in comparison to the higher gray scale side. Further, when the measurement results of the two display devices are compared, it is understood that, between the display devices, the brightness variation in the display surface is also larger on the lower gray scale (32 gray scale) side compared to the higher gray scale side.

In display devices that include light-emitting elements (self-light-emitting elements) such as OLEDs and QLEDs, the individual light-emitting diodes cannot achieve stable linear voltage and brightness characteristics in a low gray scale. As a result, the voltage and brightness characteristics of one light-emitting element constituting one pixel are unstable, and further the voltage and brightness characteristics of the plurality of light-emitting elements constituting the display surface of the display device vary, resulting in the occurrence of brightness variation in the display surface. Furthermore, brightness variation in display surfaces between different display devices also occurs.

The reason why light-emitting elements such as OLEDs and QLEDs cannot achieve stable linear voltage and brightness characteristics in a low gray scale is that the variation in the characteristics of current I-voltage V of a semiconductor layer (e.g., amorphous semiconductor layer, oxide semiconductor layer, or polysilicon semiconductor layer) that drives a light-emitting element with a constant current is more dominant than the variation in characteristics of the light-emitting element itself. Accordingly, the problem of brightness variation described above is a significant problem that always occurs when the current is restricted to emit light, that is, when displaying a low gray scale. The degree of brightness variation described above tends to be larger in QLEDs compared to OLEDs.

Further, when PWM driving is performed in the time division direction in a time division driving system, the driving method is, for example, one of introducing 10 times the current to perform 10% PWM driving, and thus a problem arises that deterioration of the service life of the light-emitting element is accelerated.

In light of the foregoing, an object of the disclosure is to provide a light-emitting element capable of achieving stable linear voltage and brightness characteristics on a lower gray scale side without performing time division driving, and a display device that suppresses brightness variation in a display surface.

Solution to Problem

In order to solve the problems described above, a light-emitting element according to the disclosure includes a light-emitting layer, an upper electrode provided on a first side of the light-emitting layer, and a lower electrode provided on a second side of the light-emitting layer opposite to the first side. The lower electrode is constituted by a first electrode and a second electrode including a first gap therebetween, the second electrode having an area larger than that of the first electrode. The upper electrode is constituted by a third electrode and a fourth electrode including a second gap therebetween, the third electrode facing the first electrode and the second electrode, the fourth electrode facing the second electrode and having an area smaller than that of the third electrode. A first charge transport layer and a second charge transport layer are provided between the lower electrode and the light-emitting layer. A third charge transport layer facing the first charge transport layer and a fourth charge transport layer facing the second charge transport layer are provided between the upper electrode and the light-emitting layer. A first region where the first electrode and the third electrode overlap includes the first charge transport layer, the light-emitting layer, and the third charge transport layer. A second region being a portion of a region where the second electrode and the third electrode overlap includes the first charge transport layer, the light-emitting layer, and the third charge transport layer. A third region being another portion of the region where the second electrode and the third electrode overlap includes the second charge transport layer, the light-emitting layer, and the fourth charge transport layer. A fourth region where the second electrode and the fourth electrode overlap includes the second charge transport layer, the light-emitting layer, and the fourth charge transport layer. The first charge transport layer and the fourth charge transport layer are transport layers of a first carrier, and the second charge transport layer and the third charge transport layer are transport layers of a second carrier different from the first carrier.

In order to solve the problems described above, a display device according to the disclosure includes a light-emitting element array including an active matrix substrate and the light-emitting element provided on the active matrix substrate, and a circuit configured to output a signal configured to switch each of the first electrode, the second electrode, the third electrode, and the fourth electrode to a cathode electrode or an anode electrode on the basis of a gray scale of an input image signal.

Advantageous Effects of Disclosure

It is possible to provide a light-emitting element capable of achieving stable linear voltage and brightness characteristics on a lower gray scale side without performing time division driving, and a display device that suppresses brightness variation in a display surface.

BRIEF DESCRIPTION OF DRAWINGS

FIGS. 7(a) to (e) are tables showing polarities of the first electrode, the second electrode, the third electrode, and the fourth electrode, and orientations of electrical fields and lit/unlit states of a first region to a fourth region in each lighting mode 1 to 5 illustrated in (a) of FIG. 6 to (e) of FIG. 6.

FIG. 14 is tables showing polarities of the first electrode, the second electrode, the third electrode, and the fourth electrode, and orientations of electrical fields and lit/unlit states of the first region to the fourth region in each lighting mode 1 to 7 illustrated in (a) of FIG. 13 to (g) of FIG. 13.

DESCRIPTION OF EMBODIMENTS

Figure 1:
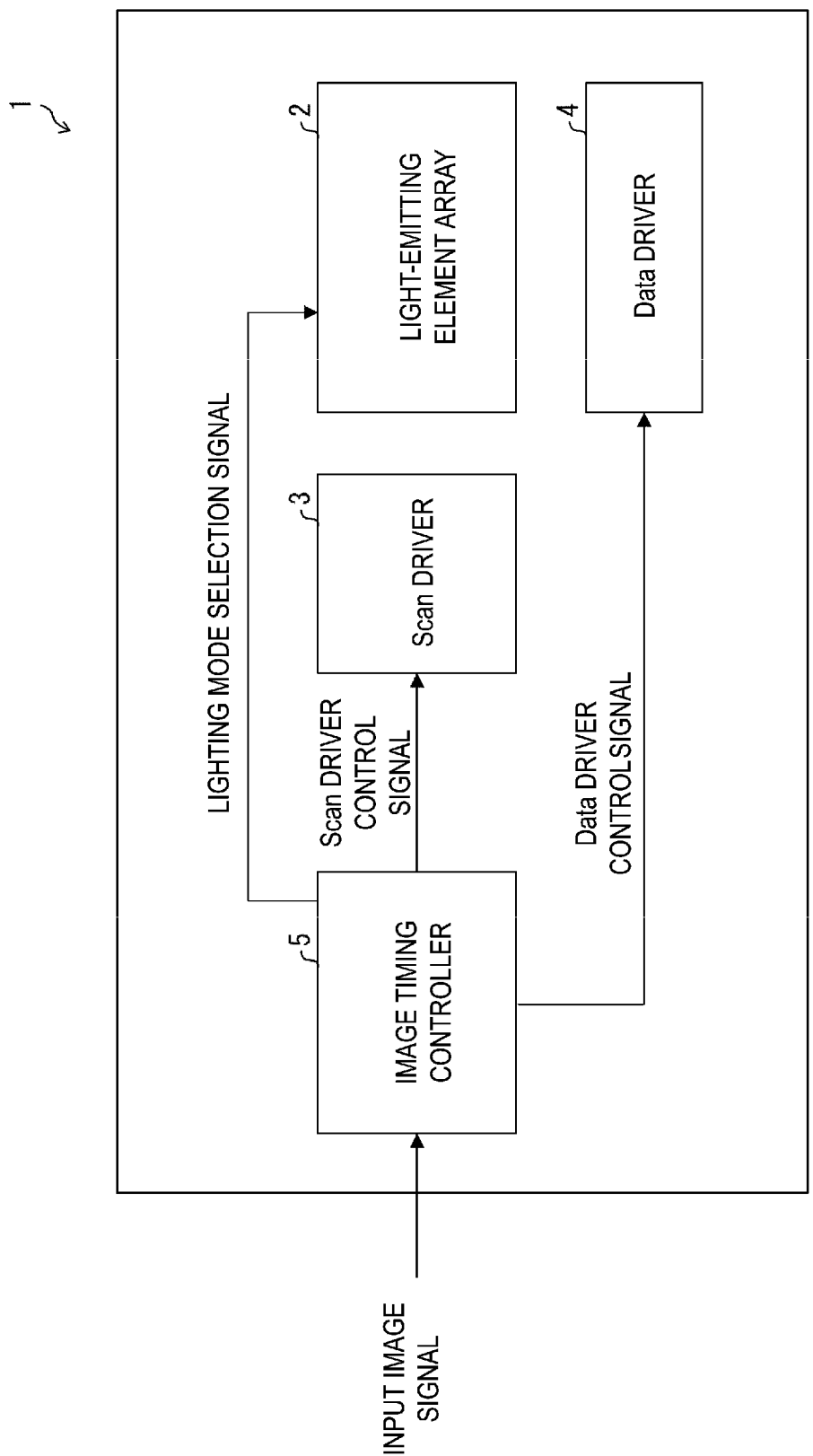
FIG. 1 is a diagram illustrating a schematic configuration of a display device according to a first embodiment.

The following is a description of embodiments of the disclosure, with reference to FIG. 1 to FIG. 16. Hereinafter, for convenience of description, components having the same functions as those described in a specific embodiment are denoted by the same reference numerals, and descriptions thereof may be omitted.

First Embodiment

FIG. 1 is a diagram illustrating a schematic configuration of a display device 1 according to a first embodiment.

The display device 1 includes a light-emitting element array 2 provided with light-emitting elements (not illustrated) on an active matrix substrate (not illustrated), a scan driver 3, a data driver 4, and an image timing controller 5 (circuit).

An input image signal is input to the image timing controller 5, a lighting mode selection signal is output from the image timing controller 5 to the light-emitting element array 2, a scan driver control signal is output from the image timing controller 5 to the scan driver 3, and a data driver control signal is output from the image timing controller 5 to the data driver 4.

The scan driver 3 switches the required voltage at Hsync timing. The data driver 4 is a driver configured to set the current of each light-emitting element (not illustrated) and subsequently cause a current to flow. The image timing controller 5 outputs a lighting mode selection signal, which is a signal for switching each of a first electrode, a second electrode, a third electrode, and a fourth electrode of each light-emitting element (not illustrated) to a cathode electrode or an anode electrode on the basis of a gray scale of the input image signal.

Figure 2:
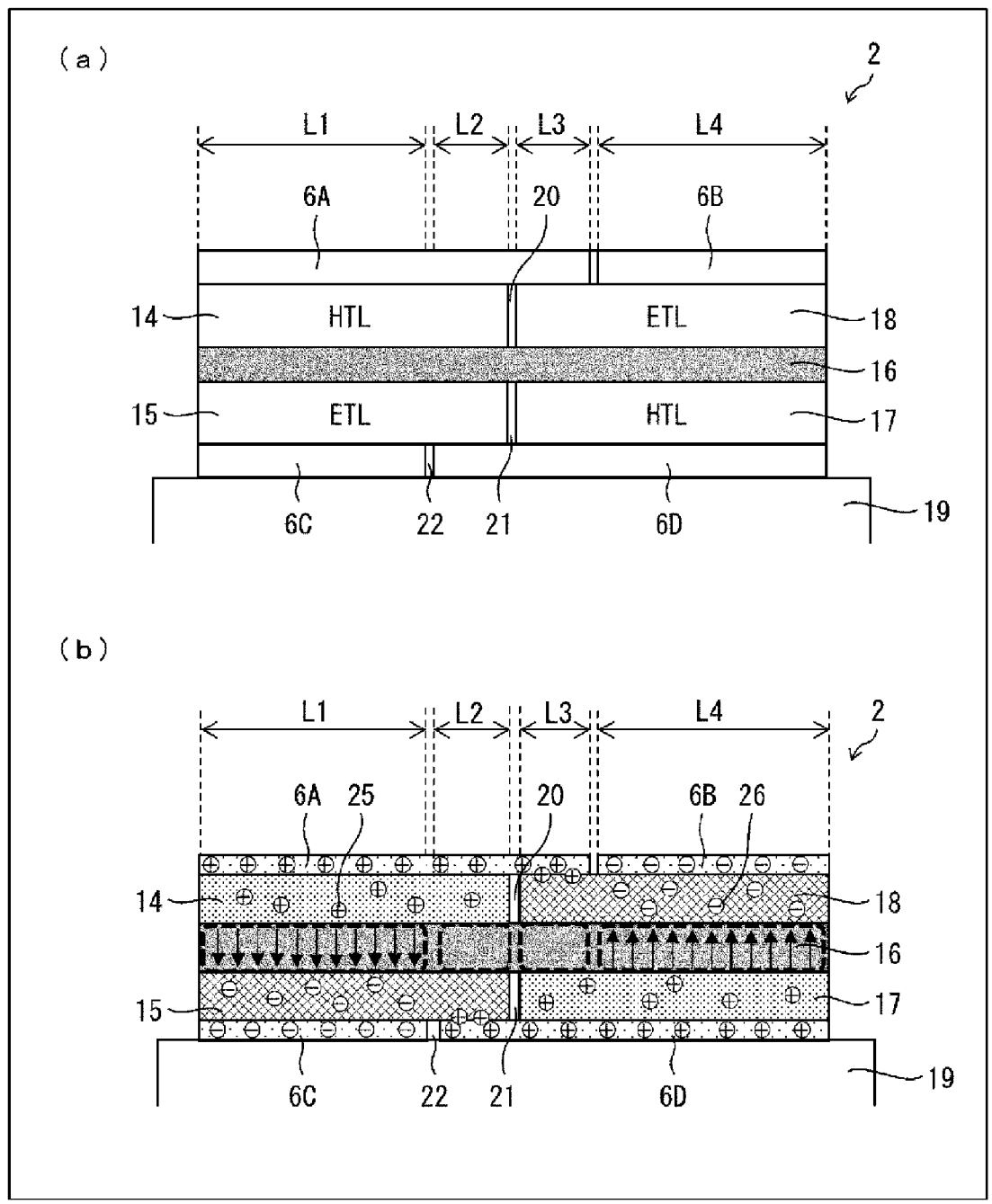
FIG. 2(a) is a diagram illustrating a schematic configuration of a light-emitting element array provided in the display device according to the first embodiment, and (b) is a diagram illustrating a light-emitting element provided in the light-emitting element array when the light-emitting element is lit.

(a) of FIG. 2 is a diagram illustrating a schematic configuration of the light-emitting element array 2, and (b) of FIG. 2 is a diagram illustrating a light-emitting element provided in the light-emitting element array 2 when the light-emitting element is lit. Note that (a) of FIG. 2 and (b) of FIG. 2 illustrate only one light-emitting element provided on an active matrix substrate 19, which is a portion of the light-emitting element array 2 including a plurality of the light-emitting elements.

Figure 3:
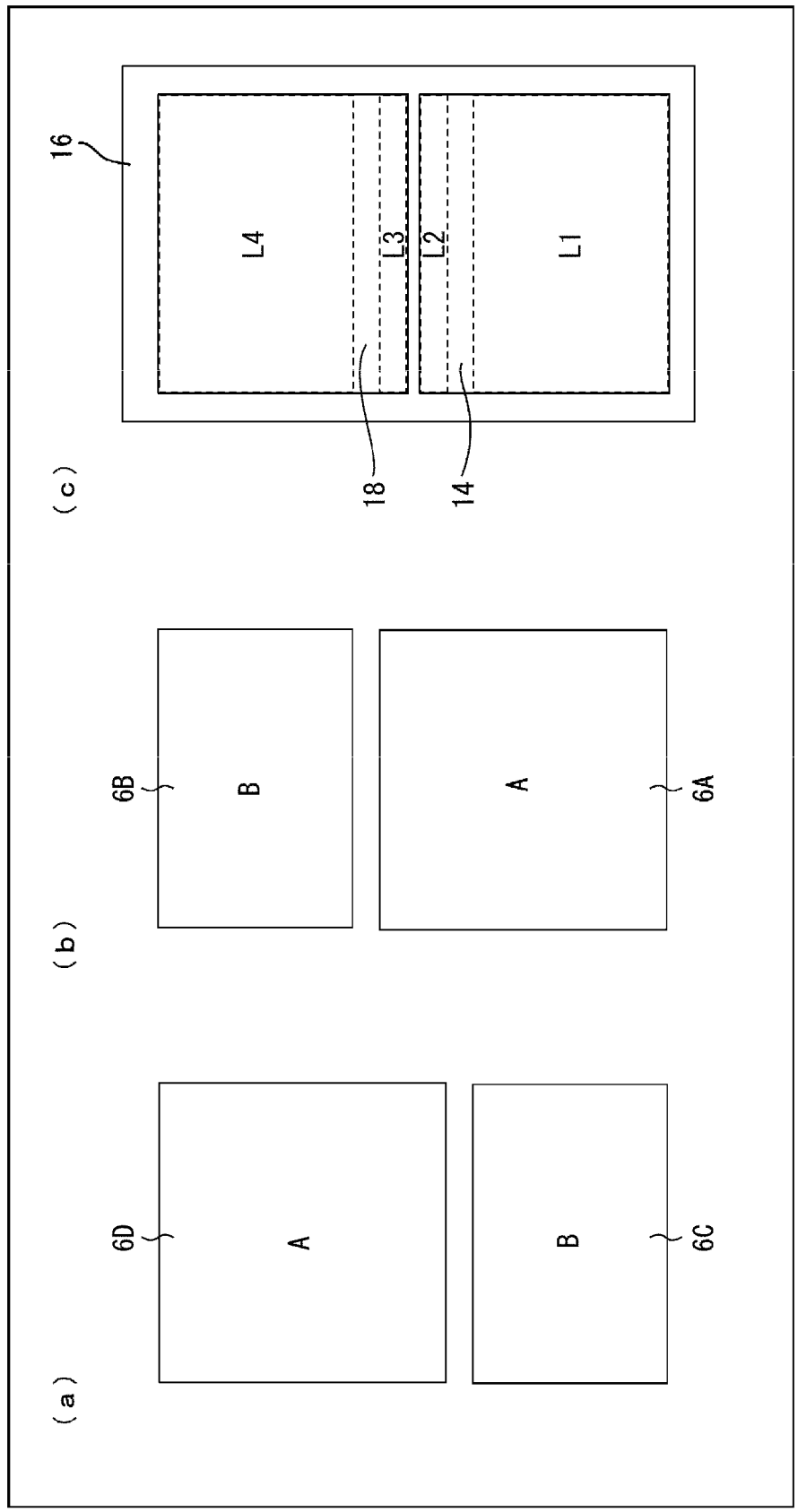
FIG. 3(a) is a top view of a first electrode and a second electrode of the light-emitting element provided in the light-emitting element array provided in the display device according to the first embodiment, (b) is a top view of a third electrode and a fourth electrode of the light-emitting element provided in the light-emitting element array, and (c) is a top view of the light-emitting element provided in the light-emitting element array.

(a) of FIG. 3 is a top view of a first electrode 6C and a second electrode 6D of the light-emitting element provided in the light-emitting element array 2, (b) of FIG. 3 is a top view of a third electrode 6A and a fourth electrode 6B of the light-emitting element provided in the light-emitting element array 2, and (c) of FIG. 3 is a top view of the light-emitting element provided in the light-emitting element array 2.

The light-emitting element array 2 includes the active matrix substrate 19 and the light-emitting elements provided on the active matrix substrate 19. Note that, although not illustrated, the active matrix substrate 19 is, for example, a substrate including a thin film transistor element (TFT element) as an active element for driving the light-emitting elements.

As illustrated in (a) of FIG. 2, the light-emitting element provided on the active matrix substrate 19 includes a light-emitting layer 16, an upper electrode provided on a first side (upper side in the diagram) of the light-emitting layer 16, and a lower electrode provided on a second side (lower side in the diagram) of the light-emitting layer 16, opposite to the first side.

The lower electrode is constituted by the first electrode 6C and the second electrode 6D including a first gap therebetween, the second electrode 6D having an area larger than that of the first electrode 6C. The upper electrode is constituted by the third electrode 6A and the fourth electrode 6B including a second gap therebetween, the third electrode 6A facing the first electrode 6C and the second electrode 6D, and the fourth electrode 6B facing the second electrode 6D and having an area smaller than that of the third electrode 6A.

An electron transport layer (ETL) 15 serving as a first charge transport layer and a hole transport layer (HTL) 17 serving as a second charge transport layer are provided between the lower electrode and the light-emitting layer 16, and a hole transport layer (HTL) 14 serving as a third charge transport layer facing the electron transport layer (ETL) 15 and an electron transport layer (ETL) 18 serving as a fourth charge transport layer facing the hole transport layer (HTL) 17 are provided between the upper electrode and the light-emitting layer 16.

In the present embodiment, description is made using as an example a case in which the electron transport layer (ETL) 15, the hole transport layer (HTL) 17, the hole transport layer (HTL) 14, and the electron transport layer (ETL) 18 are provided as the first charge transport layer, the second charge transport layer, the third charge transport layer, and the fourth charge transport layer, respectively, but no such limitation is intended. For example, the hole transport layer (HTL) 17, the electron transport layer (ETL) 15, the electron transport layer (ETL) 18, and the hole transport layer (HTL) 14 may be provided as the first charge transport layer, the second charge transport layer, the third charge transport layer, and the fourth charge transport layer, respectively.

A first region L1 in which the first electrode 6C and the third electrode 6A overlap includes the electron transport layer (ETL) 15, the light-emitting layer 16, and the hole transport layer (HTL) 14, a second region L2, which is a portion of a region where the second electrode 6D and the third electrode 6A overlap, includes the electron transport layer (ETL) 15, the light-emitting layer 16, and the hole transport layer (HTL) 14, a third region L3, which is another portion of the region where the second electrode 6D and the third electrode 6A overlap, includes the hole transport layer (HTL) 17, the light-emitting layer 16, and the electron transport layer (ETL) 18, and a fourth region L4 in which the second electrode 6D and the fourth electrode 6B overlap includes the hole transport layer (HTL) 17, the light-emitting layer 16, and the electron transport layer (ETL) 18.

The electron transport layer (ETL) 15 and the electron transport layer (ETL) 18 are transport layers of electrons 26, which constitute a first carrier, illustrated in (b) of FIG. 2, and the hole transport layer (HTL) 14 and the hole transport layer (HTL) 17 are transport layers of positive holes 25, which constitute a second carrier, illustrated in (b) of FIG. 2.

As illustrated in (a) of FIG. 2, the second electrode 6D is formed across the electron transport layer (ETL) 15 and the hole transport layer (HTL) 17, and also formed across the hole transport layer (HTL) 14 and the electron transport layer (ETL) 18. Further, the third electrode 6A is formed across the electron transport layer (ETL) 15 and the hole transport layer (HTL) 17, and also formed across the hole transport layer (HTL) 14 and the electron transport layer (ETL) 18.

Further, in the present embodiment, as illustrated in (a) of FIG. 3 and (b) of FIG. 3, description is made using as an example a case in which the second electrode 6D is formed with a same area A as that of the third electrode 6A, and the first electrode 6C is formed with a same area B as that of the fourth electrode 6B, but no such limitation is intended and the areas of the second electrode 6D and the third electrode 6A and the areas of the first electrode 6C and the fourth electrode 6B may be different.

Further, in the present embodiment, as illustrated in (a) of FIG. 2, description is made using as an example a case in which the electron transport layer (ETL) 15 is formed with the same area as that of the hole transport layer (HTL) 17, the hole transport layer (HTL) 14 is formed with the same area as that of the electron transport layer (ETL) 18, the electron transport layer (ETL) 15 has the same area as that of the hole transport layer (HTL) 14, and the hole transport layer (HTL) 17 has the same area as that of the electron transport layer (ETL) 18, but no such limitation is intended.

As described above, in the light-emitting element provided in the light-emitting element array 2, the second electrode 6D and the third electrode 6A are formed across the electron transport layer (ETL) and the hole transport layer (HTL) and thus, even though each of the lower electrode and the upper electrode has a split control system split into two, it is possible to have area lighting modes of four or more stages.

(b) of FIG. 2 is a diagram illustrating a case in which, in the light-emitting element provided in the light-emitting element array 2, the first electrode 6C is driven as a cathode electrode that supplies the electrons 26, the second electrode 6D is driven as an anode electrode that supplies the positive holes 25, the third electrode 6A is driven as an anode electrode that supplies the positive holes 25, and the fourth electrode 6B is driven as a cathode electrode that supplies the electrons 26. In this case, the positive holes 25 supplied from the second electrode 6D are blocked by the electron transport layer (ETL) 15, and thus the second region L2 does not emit light. Further, the positive holes 25 supplied from the third electrode 6A are blocked by the electron transport layer (ETL) 18, and thus the third region L3 does not emit light. On the other hand, the first region L1 and the fourth region L4 emit light.

As illustrated in (b) of FIG. 2, in the first region L1, of the potentials of the first electrode 6C and the third electrode 6A facing each other, the potential of the third electrode 6A is higher, and thus an electrical field of a downward direction in the diagram is generated in the light-emitting layer 16 and, in the fourth region L4, of the potentials of the second electrode 6D and the fourth electrode 6B facing each other, the potential of the second electrode 6D is higher, and thus an electrical field of an upward direction in the diagram is generated in the light-emitting layer 16, causing the first region L1 and the fourth region L4 to emit light. On the other hand, in the second region L2, the potentials of the second electrode 6D and the third electrode 6A facing each other are the same, and thus an electrical field is not generated in the light-emitting layer 16 and light is not emitted. Similarly, in the third region L3, the potentials of the second electrode 6D and the third electrode 6A facing each other are the same, and thus an electrical field is not generated in the light-emitting layer 16 and light is not emitted.

The first charge transport layer provided between the first electrode 6C and the second electrode 6D, which constitute the lower electrode, and the light-emitting layer 16, and the fourth electric charge transport layer provided between the third electrode 6A and the fourth electrode 6B, which constitute the upper electrode, and the light-emitting layer 16 are transport layers of the first carrier. Further, the second charge transport layer provided between the second electrode 6D, which constitutes the lower electrode, and the light-emitting layer 16, and the third electric charge transport layer provided between the third electrode 6A, which constitutes the upper electrode, and the light-emitting layer 16 are transport layers of the second carrier different from the first carrier. In the present embodiment, description is made using as an example a case in which the first carrier is the electron 26, the second carrier is the positive hole 25, the first charge transport layer provided between the first electrode 6C and the second electrode 6D, which constitute the lower electrode, and the light-emitting layer 16 is the electron transport layer (ETL) 15, the second charge transport layer provided between the second electrode 6D, which constitutes the lower electrode, and the light-emitting layer 16 is the hole transport layer (HTL) 17, the third charge transport layer provided between the third electrode 6A, which constitutes the upper electrode, and the light-emitting layer 16 is the hole transport layer (HTL) 14, and the fourth charge transport layer provided between the third electrode 6A and the fourth electrode 6B, which constitute the upper electrode, and the light-emitting layer 16 is the electron transport layer (ETL) 18, but no such limitation is intended. In a case in which the first carrier is the positive hole 25 and the second carrier is the electron 26, the hole transport layers (HTL) are replaced with the electron transport layers (ETL) and the electron transport layers (ETL) are replaced with the hole transport layers (HTL) in the configuration illustrated in (a) of FIG. 2 and (b) of FIG. 2. Although not illustrated, specifically, the first charge transport layer provided between the first electrode 6C and the second electrode 6D, which constitute the lower electrode, and the light-emitting layer 16 is a hole transport layer (HTL), the second charge transport layer provided between the second electrode 6D, which constitutes the lower electrode, and the light-emitting layer 16 is an electron transport layer (ETL), the third charge transport layer provided between the third electrode 6A, which constitutes the upper electrode, and the light-emitting layer 16 is an electron transport layer (ETL), and the fourth charge transport layer provided between the third electrode 6A and the fourth electrode 6B, which constitute the upper electrode, and the light-emitting layer 16 is a hole transport layer (HTL).

Figure 9:
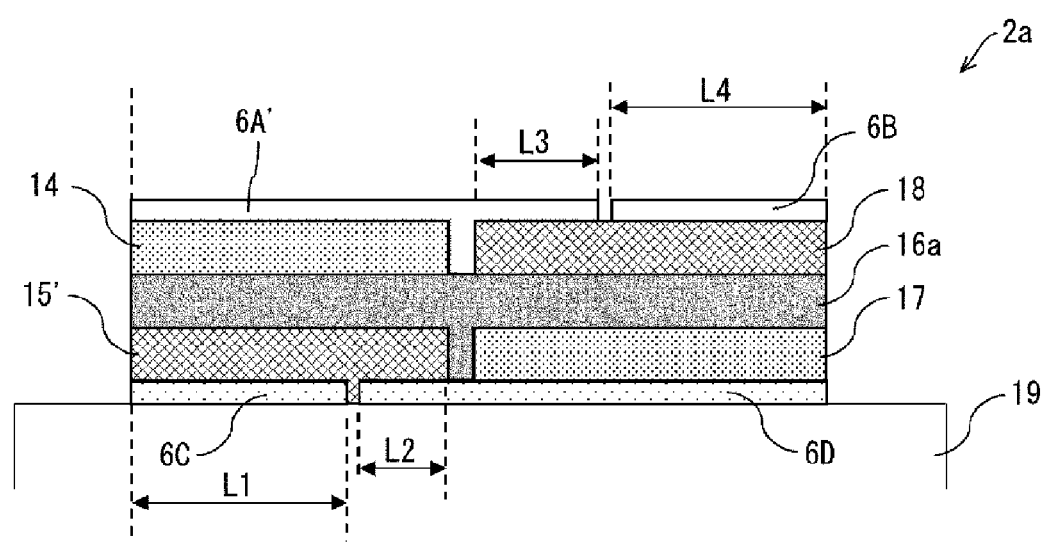
FIG. 9 is a diagram illustrating a schematic configuration of another light-emitting element array that can be provided in the display device according to the first embodiment.
Figure 10:
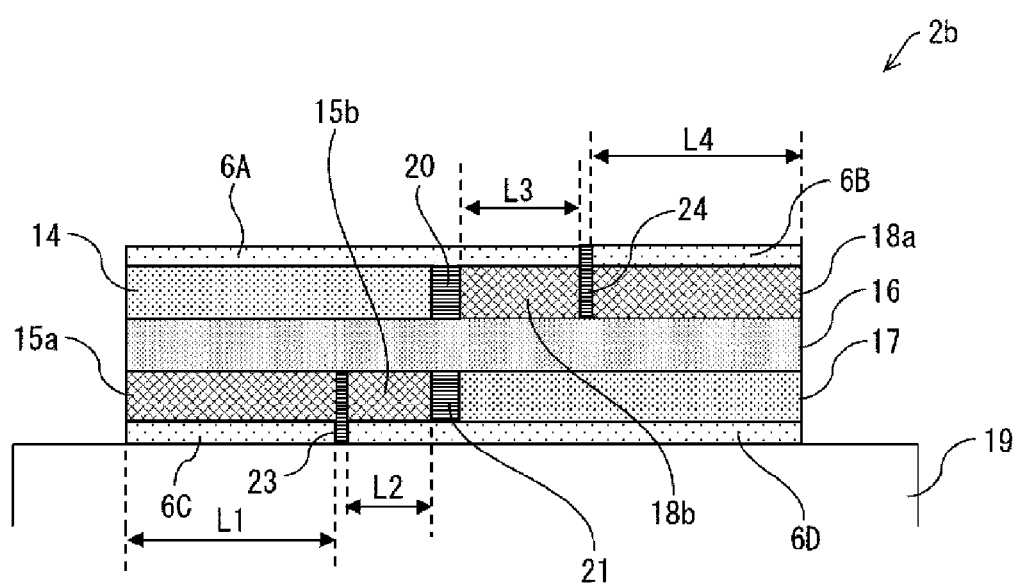
FIG. 10 is a diagram illustrating a schematic configuration of yet another light-emitting element array that can be provided in the display device according to the first embodiment.

In the present embodiment, as illustrated in (a) of FIG. 2 and (b) of FIG. 2, description is made using as an example a case in which an insulator 22 is formed in the first gap formed between the first electrode 6C and the second electrode 6D, an insulator 21 is formed in a third gap formed between the electron transport layer (ETL) 15 and the hole transport layer (HTL) 17, and an insulator 20 is formed in a fourth gap formed between the hole transport layer (HTL) 14 and the electron transport layer (ETL) 18, but no such limitation is intended, as described later with reference to FIG. 9 and FIG. 10.

As illustrated in (c) of FIG. 3, in the light-emitting element provided in the light-emitting element array 2, an area of the first region L1 and an area of the fourth region L4 are the same, and an area of the second region L2 and an area of the third region L3 are the same. Further, the area of the first region L1 or the area of the fourth region L4 is greater than the area of the second region L2 or the area of the third region L3.

Note that, in the present embodiment, across the entire first region L1, the hole transport layer (HTL) 14, the light-emitting layer 16, and the electron transport layer (ETL) 15 overlap, and thus the area of the first region L1 is the area of the light-emitting region. Across the entire second region L2 as well, the hole transport layer (HTL) 14, the light-emitting layer 16, and the electron transport layer (ETL) 15 overlap, and thus the area of the second region L2 is the area of the light-emitting region. Across the entire third region L3 as well, the hole transport layer (HTL) 17, the light-emitting layer 16, and the electron transport layer (ETL) 18 overlap, and thus the area of the third region L3 is the area of the light-emitting region. Across the entire fourth region L4 as well, the hole transport layer (HTL) 17, the light-emitting layer 16, and the electron transport layer (ETL) 18 overlap, and thus the area of the fourth region L4 is the area of the light-emitting region. However, no such limitation is intended, and the hole transport layer (HTL), the light-emitting layer 16, and the electron transport layer (ETL) may overlap across only a portion of each of the first region L1 to the fourth region L4.

Figure 4:
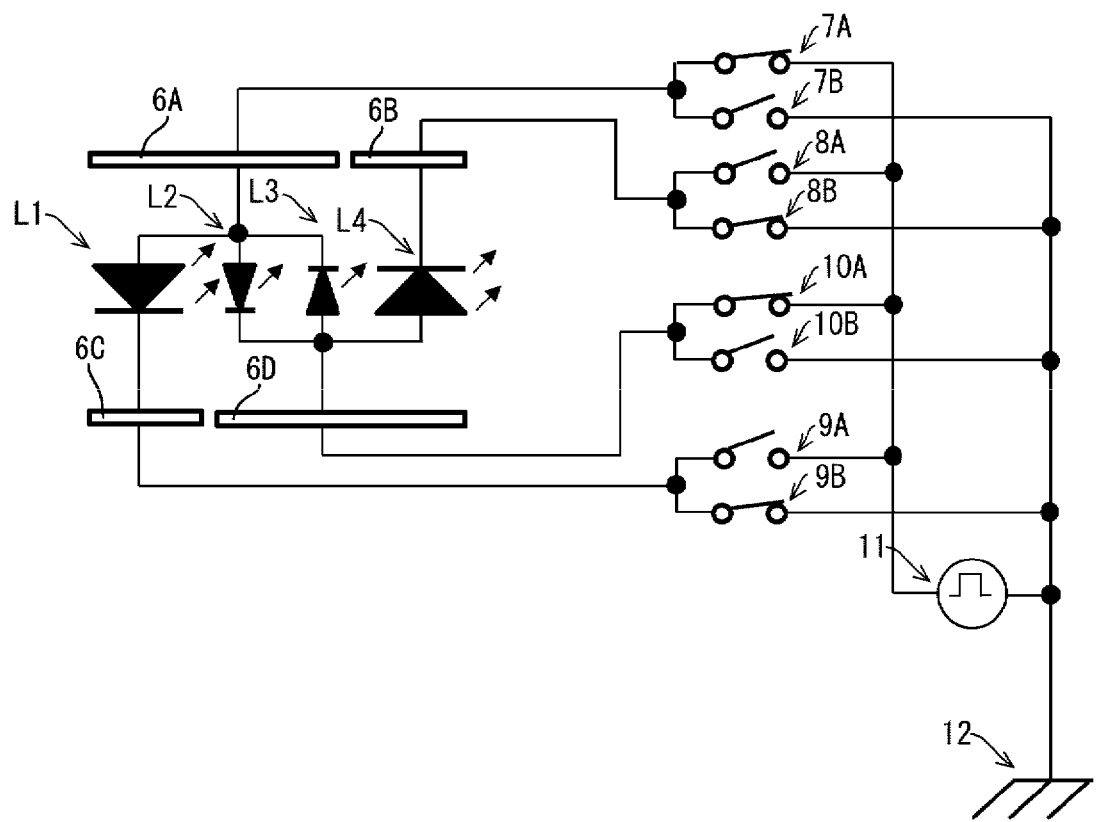
FIG. 4 is a diagram illustrating a circuit including a plurality of switching elements controlled on the basis of a lighting mode selection signal from an image timing controller.

FIG. 4 is a diagram illustrating a circuit including a plurality of switching elements 7A to 10A, 7B to 10B controlled on the basis of the lighting mode selection signal from the image timing controller 5 illustrated in FIG. 1.

The on/off states of the plurality of switching elements 7A to 10A, 7B to 10B illustrated in FIG. 4 are controlled on the basis of the lighting mode selection signal from the image timing controller 5. The switching elements 7A, 7B are switching elements that electrically connect the third electrode 6A and one of an ELVDD supply source 11 and an ELVSS supply source 12. The switching elements 8A, 8B are switching elements that electrically connect the fourth electrode 6B and one of the ELVDD supply source 11 and the ELVSS supply source 12. The switching elements 9A, 9B are switching elements that electrically connect the first electrode 6C and one of the ELVDD supply source 11 and the ELVSS supply source 12. The switching elements 10A, 10B are switching elements that electrically connect the second electrode 6D and one of the ELVDD supply source 11 and the ELVSS supply source 12.

The on/off states of the plurality of switching elements 7A to 10A, 7B to 10B illustrated in FIG. 4 are based on the lighting mode selection signal output from the image timing controller 5 configured to drive the first electrode 6C as a cathode electrode that supplies the electrons 26, drive the second electrode 6D as an anode electrode that supplies the positive holes 25, drive the third electrode 6A as an anode electrode that supplies the positive holes 25, and drive the fourth electrode 6B as a cathode electrode that supplies the electrons 26. Accordingly, the switching element 7A is on, the switching element 7B is off, the third electrode 6A is supplied with ELVDD from the ELVDD supply source 11, and the polarity of the third electrode 6A is positive. Further, the switching element 8A is off, the switching element 8B is on, the fourth electrode 6B is supplied with ELVSS from the ELVSS supply source 12, and the polarity of the fourth electrode 6B is negative. Further, the switching element 9A is off, the switching element 9B is on, the first electrode 6C is supplied with ELVSS from the ELVSS supply source 12, and the polarity of the first electrode 6C is negative. Further, the switching element 10A is on, the switching element 10B is off, the second electrode 6D is supplied with ELVDD from the ELVDD supply source 11, and the polarity of the second electrode 6D is positive.

Figure 5:
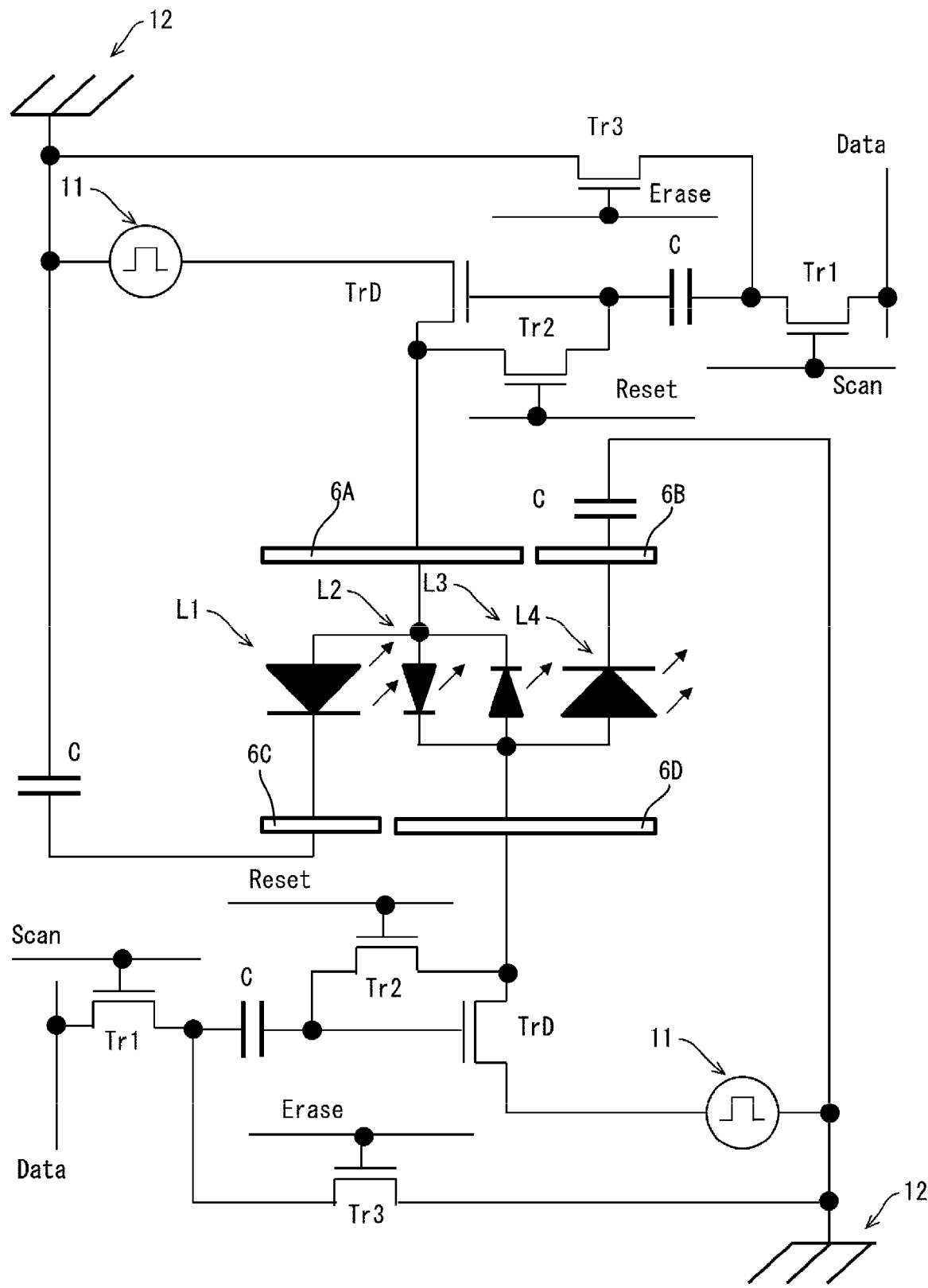
FIG. 5 is a diagram illustrating a pixel circuit when the plurality of switching elements are controlled as illustrated in FIG. 4.

FIG. 5 is a diagram illustrating a pixel circuit when the plurality of switching elements 7A to 10A, 7B to 10B are controlled as illustrated in FIG. 4.

As illustrated in FIG. 5, a data line (Data), a scanning line (Scan), a reset line (Reset), and an erase line (Erase) are provided in a pixel circuit of a single pixel corresponding to the light-emitting element provided with the first electrode 6C, the second electrode 6D, the third electrode 6A, and the fourth electrode 6B. Note that a scanning signal is supplied to the scanning line (Scan) from the scan driver 3 illustrated in FIG. 1, and a data signal is supplied to the data line (Data) from the data driver 4 illustrated in FIG. 1.

Further, the pixel circuit of a single pixel includes a drive transistor (TrD), a switching transistor (Tr2) connected between a drain (or source) and a gate of the drive transistor (TrD), a series circuit of a capacitance element (C) and a switching transistor (Tr1) connected between a gate of the drive transistor (TrD) and the data line (Data), and a switching transistor (Tr3) that inputs ELVSS from the ELVSS supply source 12 at a connection point of the switching transistor (Tr1) and the capacitance element (C).

Herein, the gate of the switching transistor (Tr2) is connected to the reset line (Reset), the gate of the switching transistor (Tr1) is connected to the scanning line (Scan), and the gate of the switching transistor (Tr3) is connected to the erase line (Erase). ELVDD is then supplied from the ELVDD supply source 11 from the source (or drain) of the drive transistor (TrD).

In the light-emitting element provided with the first electrode 6C, the second electrode 6D, the third electrode 6A, and the fourth electrode 6B, ELVDD can be applied to the second electrode 6D and the third electrode 6A, and ELVSS can be applied to the first electrode 6C and the fourth electrode 6B, by the pixel circuit illustrated in FIG. 5.

Figure 6:
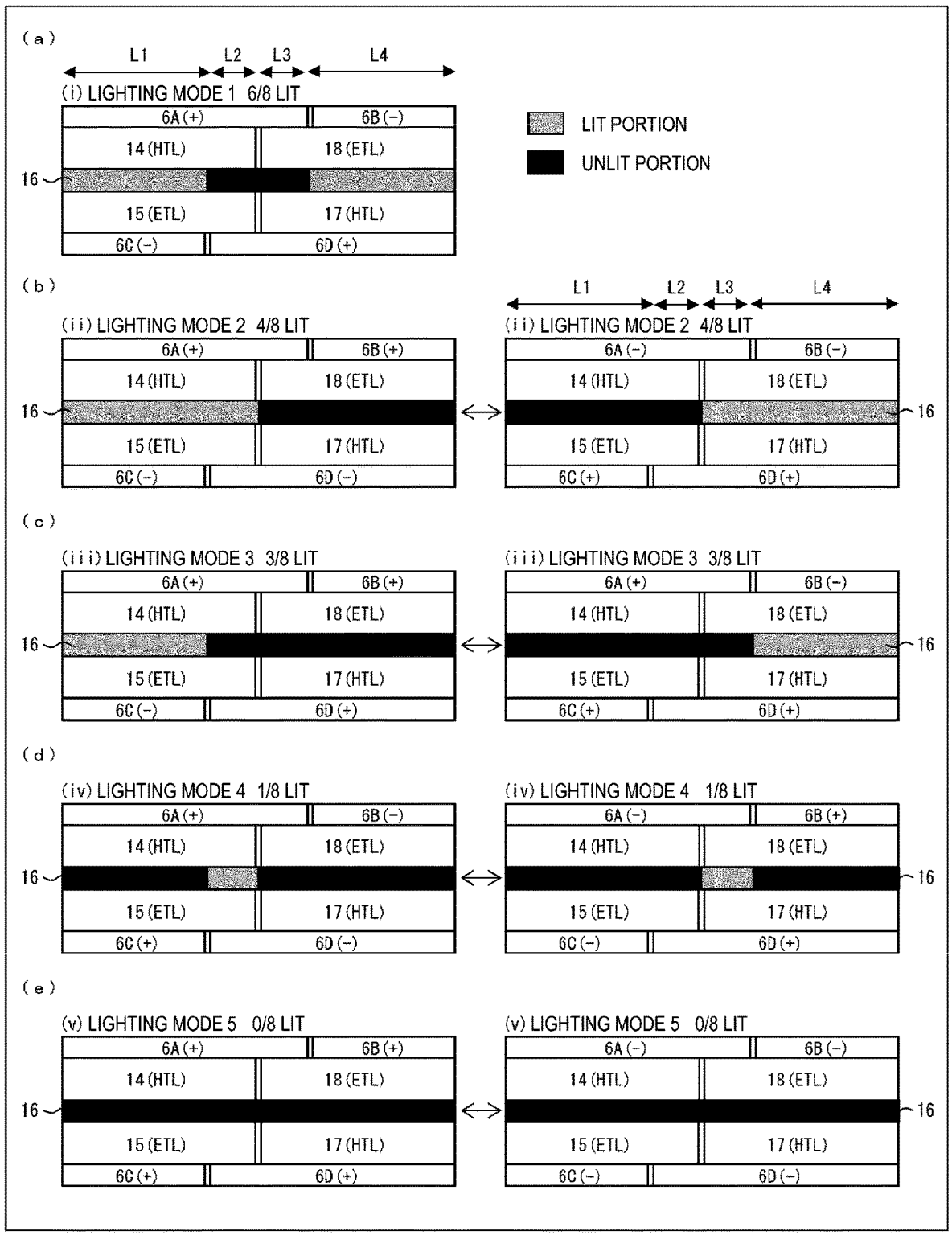
FIGS. 6(a) to (e) are diagrams illustrating polarities of the first electrode, the second electrode, the third electrode, and the fourth electrode, lit portions, and unlit portions in individual lighting modes 1 to 5.

(a) of FIG. 6 to (e) of FIG. 6 are diagrams illustrating polarities of the first electrode 6C, the second electrode 6D, the third electrode 6A, and the fourth electrode 6B, lit portions, and unlit portions in individual lighting modes 1 to 5.

The image timing controller 5 illustrated in FIG. 1 outputs, on the basis of a gray scale value of the input image signal, a lighting mode selection signal for selecting one of the lighting modes 1 to 5 illustrated in (a) of FIG. 6 to (e) of FIG. 6. For example, in a case in which the number of gray scales of the input image signal is 8 bits, the image timing controller 5 outputs a lighting mode selection signal for selecting the lighting mode 1 (6/8 lit) illustrated in (a) of FIG. 6 when the gray scale value of the input image signal is 160 gray scale to 256 gray scale, outputs a lighting mode selection signal for selecting the lighting mode 2 (4/8 lit) illustrated in (b) of FIG. 6 when the gray scale value of the input image signal is 64 gray scale to 159 gray scale, outputs a lighting mode selection signal for selecting the lighting mode 3 (3/8 lit) illustrated in (c) of FIG. 6 when the gray scale value of the input image signal is 32 gray scale to 63 gray scale, outputs a lighting mode selection signal for selecting the lighting mode 4 (1/8 lit) illustrated in (d) of FIG. 6 when the gray scale value of the input image signal is 2 gray scale to 31 gray scale, and outputs a lighting mode selection signal for selecting the lighting mode 5 (0/8 lit) illustrated in (e) of FIG. 6 when the gray scale value of the input image signal is 1 gray scale.

Note that the display of each gray scale in each lighting mode is performed on the basis of the data signal supplied via the data line (Data) illustrated in FIG. 5.

In a case in which (area of first region (L1))/(area of first region (L1)+area of second region (L2)+area of third region (L3)+area of fourth region (L4))=3/8, (area of fourth region (L4))/(area of first region (L1)+area of second region (L2)+area of third region (L3)+area of fourth region (L4))=3/8, (area of second region (L2))/(area of first region (L1)+area of second region (L2)+area of third region (L3)+area of fourth region (L4))=1/8, and (area of third region (L3))/(area of first region (L1)+area of second region (L2)+area of third region (L3)+area of fourth region (L4))=1/8 as in the present embodiment, regions of the ratios below are lit in the lighting modes 1 to 5 illustrated in (a) of FIG. 6 to (e) old FIG. 6.

Note that, needless to say, as long as the area of the first region L1 is the same as the area of the fourth region L4 and the area of the third region L3 is the same as the area of the second region L2, the area of the first region L1, the area of the second region L2, the area of the third region L3, and the area of the fourth region L4 can be adjusted as appropriate.

In the lighting mode 1 illustrated in (a) of FIG. 6, (area of first region (L1)+area of fourth region (L4))/(area of first region (L1)+area of second region (L2)+area of third region (L3)+area of fourth region (L4))=6/8 are lit. In the lighting mode 2 illustrated in (b) of FIG. 6, (area of first region (L1)+area of second region (L2))/(area of first region (L1)+area of second region (L2)+area of third region (L3)+area of fourth region (L4))=4/8 or (area of third region (L3)+area of fourth region (L4))/(area of first region (L1)+area of second region (L2)+area of third region (L3)+area of fourth region (L4))=4/8 are lit. In the lighting mode 3 illustrated in (c) of FIG. 6, (area of first region (L1))/(area of first region (L1)+area of second region (L2)+area of third region (L3)+area of fourth region (L4))=3/8 or (area of fourth region (L4))/(area of first region (L1)+area of second region (L2) area of third region (L3)+area of fourth region (L4))=3/8 are lit. In the lighting mode 4 illustrated in (d) of FIG. 6, (area of second region (L2))/(area of first region (L1)+area of second region (L2)+area of third region (L3)+area of fourth region (L4))=1/8 or (area of third region (L3))/(area of first region (L1)+area of second region (L2)+area of third region (L3)+area of fourth region (L4))=1/8 are lit. In the lighting mode 5 illustrated in (e) of FIG. 6, (0/(area of first region (L1)+area of second region (L2)+area of third region (L3)+ area of fourth region (L4))=0/8 are lit.

As illustrated in (b) of FIG. 6 to (d) of FIG. 6, in the case of the lighting modes 2 to 4, different regions of the light-emitting layer 16 can be made to emit light in a first lighting period and a second lighting period following the first lighting period, making it possible to prevent a reduction in service life of the light-emitting element.

Further, for example, as illustrated in (b) of FIG. 6, (d) of FIG. 6, and (e) of FIG. 6, when a voltage of a polarity opposite to that of the first lighting period is applied to each of the first electrode 6C, the second electrode 6D, the third electrode 6A, and the fourth electrode 6B, that is, when alternating current driving is performed, in the second lighting period following the first lighting period, a reduction in service life of the light-emitting element can be prevented.

Note that the length of the first lighting period and the length of the second lighting period may be the same or may be different.

(a) of FIG. 7 to (e) of FIG. 7 are tables showing polarities of the first electrode 6C, the second electrode 6D, the third electrode 6A, and the fourth electrode 6B, and orientations of electrical fields and the lit/unlit states of the first region L1 to the fourth region L4 in each lighting mode 1 to 5 illustrated in (a) of FIG. 6 to (e) of FIG. 6.

In (a) of FIG. 7 to (e) of FIG. 7, the polarities of the first electrode 6C, the second electrode 6D, the third electrode 6A, and the fourth electrode 6B being positive means that ELVDD is supplied to these electrodes, and the polarities of the first electrode 6C, the second electrode 6D, the third electrode 6A, and the fourth electrode 6B being negative means that ELVSS is supplied to these electrodes. Further, the orientation of the electrical field being downward means that an electrical field is generated in a direction from the upper electrode to the lower electrode in the light-emitting layer 16, and the orientation of the electrical field being upward means that an electrical field is generated in a direction from the lower electrode to the upper electrode in the light-emitting layer 16. The orientation of the electrical field being none means that no electrical field is generated in the light-emitting layer 16. Further, the lit/unlit state being ON means that corresponding regions of the first region L1, the second region L2, the third region L3, and the fourth region L4 are lit, and the lit/unlit state being OFF means that corresponding regions of the first region L1, the second region L2, the third region L3, and the fourth region L4 are not lit.

Figure 8:
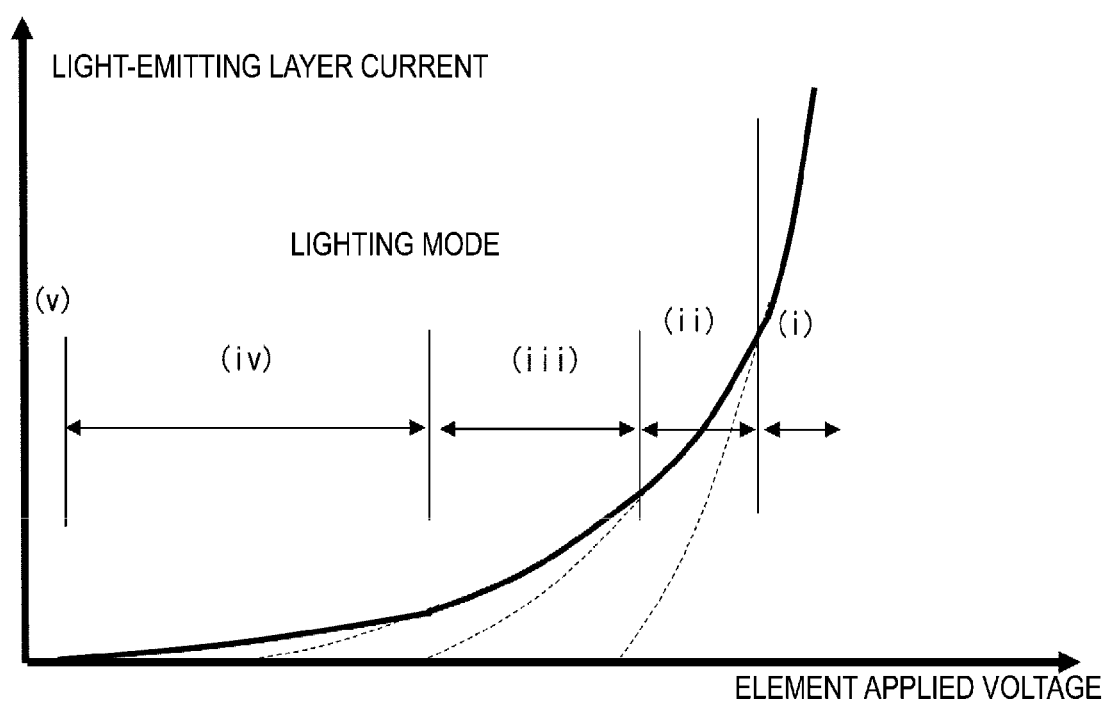
FIG. 8 is a graph showing a relationship between an element-applied voltage and a light-emitting layer current in the light-emitting element provided in the light-emitting element array of the display device according to the first embodiment.

FIG. 8 is a graph showing a relationship between an element-applied voltage and a light-emitting layer current in the light-emitting element provided in the light-emitting element array 2 of the display device 1 according to the first embodiment.

As illustrated, in the light-emitting element, stable linear element-applied voltage and light-emitting layer current (brightness) characteristics can be obtained from a low gray scale to a high gray scale, making it possible to realize the display device 1 in which brightness variation in the display surface is suppressed.

In the present embodiment, a case in which the lighting modes are divided into the five lighting modes 1 to 5 has been described as an example, but the number of lighting modes is not limited thereto.

Further, in the present embodiment, a case in which the lighting regions are divided into the four regions of the first region L1, the second region L2, the third region L3, and the fourth region L4 has been described as an example, but no such limitation is intended.

Further, in the present embodiment, a case in which the area of the first region L1 is the same as the area of the fourth region L4, and the area of the second region L2 is the same as the area of the third region L3 has been described as an example, but no such limitation is intended.

Further, in the present embodiment, a case in which, in the pixel circuit of a single pixel illustrated in FIG. 5, the data line (Data) on the upper side in the diagram and the data line (Data) on the lower side in the diagram are supplied with the same data signal has been described as an example, but no such limitation is intended, and the data line (Data) on the upper side in the diagram and the data line (Data) on the lower side in the diagram may be provided with different data signals.

Further, in the present embodiment, a case in which the lighting mode selection signal is output from the image timing controller 5 (circuit) has been described as an example, but no such limitation is intended, and the lighting mode selection signal may be output from the data driver 4 (circuit), for example.

The constituent materials of the hole transport layer (HTL) 14 and the hole transport layer (HTL) 17 are not particularly limited as long as the materials are hole transport materials capable of stabilizing the transport of the positive holes 25 to the light-emitting layer 16. Among these, a hole transport material having high hole mobility is preferable. Furthermore, the hole transport material is preferably a material (electron blocking material) capable of preventing the penetration of electrons that have traveled from the cathode electrode. This is because the coupling efficiency of the positive holes 25 and the electrons 26 in the light-emitting layer 16 can be increased. Examples of materials used in such a hole transport layer include arylamine derivatives, anthracene derivatives, carbazole derivatives, thiophene derivatives, fluorene derivatives, distyrylbenzene derivatives, and spire compounds. Note that the material used in such a hole transport layer is more preferably polyvinyl carbazole (PVK) or poly[(9,9-dioctylfluorenyl-2, 7-diyl)-co-(4,4'-(N-(4-sec-butylphenyl))diphenylamine)] (TFB). The PVK and the TFB improve the efficiency of light emission resulting from recombination of the electrons 26 and the positive holes 25 in the light-emitting layer 16, and thus exhibit the effect of improving the light-emission characteristics of the electroluminescent element.

Further, a hole injection layer (not illustrated) may be formed on the third electrode 6A side of the hole transport layer (HTL) 14 and the second electrode 6D side of the hole transport layer (HTL) 17. The material used for the hole injection layer is not particularly limited as long as the material is a hole injection material capable of stabilizing the injection of the positive holes 25 into the light-emitting layer 16. Examples of the hole injection material include conductive polymers such as arylamine derivatives, porphyrin derivatives, phthalocyanine derivatives, carbazole derivatives, polyaniline derivatives, polythiophene derivatives, and polyphenylene vinylene derivatives. Note that the material used in the hole injection layer is more preferably poly(3,4-ethylenedioxythiophene)-polystyrene sulfonate (PEDOT-PSS). The PEDOT-PSS improves the efficiency of light emission resulting from recombination of the electrons 26 and the positive holes 25 in the light-emitting layer 16, and thus exhibits the effect of improving the light-emission characteristics of the electroluminescent element.

Examples of the method of forming the hole transport layer (HTL) 14, the hole transport layer (HTL) 17, and the hole injection layer include vapor deposition, a printing method, an ink-jet method, a spin coating method, a casting method, a dipping method, a bar coating method, a blade coating method, a roll coating method, a gravure coating method, a flexographic printing method, a spray coating method, a photolithography method, and a self-organization method (alternating adsorption method, self-organized monolayer method), but are not limited thereto. Among these, vapor deposition, the spin coating method, the ink-jet method, or the photolithography method are preferably used.

As constituent materials for the electron transport layer (ETL) 15 and the electron transport layer (ETL) 18, in order to increase the recombination efficiency of the positive holes 25 and the electrons 26 in the light-emitting layer 16, the material of the electron transport layer is preferably a material capable of preventing the penetration of the positive holes 25 that have traveled from the anode electrode. However, when zinc oxide is used in the electron transport layer, the difference between the ionization potentials of the light-emitting layer 16 and the electron transport layer, that is, the barrier of hole transport from the light-emitting layer 16 to the electron transport layer is relatively large, exhibiting the effect of increasing the recombination efficiency of the positive holes 25 and the electrons 26 in the light-emitting layer 16 and improving and the luminous efficiency as well.

Further, an electron injection layer (not illustrated) may be formed on the first electrode 6C side of the electron transport layer (ETL) 15 or on the fourth electrode 6B side of the electron transport layer (ETL) 18. The material used for the electron injection layer is not particularly limited as long as the material is an electron injection material capable of stabilizing the injection of the electrons 26 into the light-emitting layer 16. Examples of the electron injection material include alkali metals or alkaline earth metals, oxides of alkali metals or alkaline earth metals, fluorides of alkali metals or alkaline earth metals, and organic complexes of alkali metals, such as aluminum, strontium, calcium, lithium, cesium, magnesium oxide, aluminum oxide, strontium oxide, lithium oxide, lithium fluoride, magnesium fluoride, strontium fluoride, calcium fluoride, barium fluoride, cesium fluoride, and sodium polymethylmethacrylate polystyrene sulfonate.

Examples of the method of forming the electron transport layer (ETL) 15, the electron transport layer (ETL) 18, and the electron injection layer include vapor deposition, a printing method, an ink-jet method, a spin coating method, a casting method, a dipping method, a bar coating method, a blade coating method, a roll coating method, a gravure coating method, a flexographic printing method, a spray coating method, a photolithography method, and a self-organization method (alternating adsorption method, self-organized monolayer method). Among these, vapor deposition, the spin coating method, the ink-jet method, or the photolithography method are preferably used.

In the present embodiment, a quantum dot light-emitting layer is used as the light-emitting layer 16, but no such limitation is intended. The quantum dot light-emitting layer is a layer that emits light as a result of an occurrence of recombination between the positive holes 25 and the electrons 26. In the present embodiment, as a luminescent material, quantum dots (semiconductor nanoparticles) layered in one or a plurality of layers are provided as a quantum dot light-emitting layer having a red emission peak in a red pixel, a quantum dot light-emitting layer having a green emission peak in a green pixel, and a quantum dot light-emitting layer having a blue emission peak in a blue pixel. The material constituting the quantum dot light-emitting layer may include one or a plurality of semiconductor materials selected from the group including, for example, Cd, S, Te, Se, Zn, In, N, P, As, Sb, Al, Ga, Pb, Si, Ge, Mg, and compounds thereof. Further, the quantum dot light-emitting layer may be a two-component core type, a three-component core type, a four-component core type, a core-shell type, or a core multi-shell type. Further, the quantum dot light-emitting layer may include doped nanoparticles or may include a composition gradient structure. The thickness of the quantum dot light-emitting layer is not particularly limited as long as the thickness is capable of expressing a function of providing a place for recombination between the electrons 26 and the positive holes 25 to achieve light emission, and can be, for example, from about 1 nm to 200 nm.

The method of forming the quantum dot light-emitting layer as the light-emitting layer 16 is not particularly limited as long as the method is capable of forming the fine pattern required by the electroluminescent element. Examples include vapor deposition, a printing method, an ink-jet method, a spin coating method, a casting method, a dipping method, a bar coating method, a blade coating method, a roll coating method, a gravure coating method, a flexographic printing method, a spray coating method, a photolithography method, and a self-organization method (alternating adsorption method, self-organized monolayer method). Among these, vapor deposition, the spin coating method, the ink-jet method, or the photolithography method are preferably used. Examples of the vapor deposition include a vacuum vapor deposition technique, a sputtering method, and an ion plating method, and specific examples of the vacuum vapor deposition technique include resistive heating vapor deposition, flash vapor deposition, arc vapor deposition, laser vapor deposition, high frequency heating vapor deposition, and electron beam vapor deposition. When the light-emitting layer 16 is formed by application of a coating solution such as a spin coating method or an ink-jet method, the solvent of the coating solution is not particularly limited as long as the solvent can dissolve or disperse the constituent materials of the light-emitting layer 16, and examples thereof include toluene, xylene, cyclohexanone, cyclohexanol, tetraphosphorus, mesitylene, methylene chloride, tetrahydrofuran, dichloroethane, and chloroform.

The first electrode 6C, the second electrode 6D, the third electrode 6A, and the fourth electrode 6B need to be disposed in parallel in a lateral direction and separated electrically as well as in terms of film from each other. Note that, for example, the third electrode 6A and the fourth electrode 6B are preferably transparent, while the first electrode 6C and the second electrode 6D, which are electrodes opposite to the light extraction surface, may or may not be transparent. Further, the resistance of these electrodes is preferably low, and a metal material that is generally an electrically conductive material is used, but an organic compound or an inorganic compound may be used. To facilitate injection of the positive holes 25 and the electrons 26, examples of electrode materials include metals such as Au, Ta, W, Pt, Ni, Pd, Cr, Cu, Mo, alkali metals, and alkaline earth metals; oxides of these metals; alloys such as Al alloys such as AlLi, AlCa, and AlMg, Mg alloys such as MgAg, Ni alloys, Cr alloys, alloys of alkali metals, and alloys of alkaline earth metals; inorganic oxides such as indium tin oxide (ITO), indium zinc oxide (IZO), zinc oxide (ZnO), and indium oxide; conductive polymers such as metal-doped polythiophene, polyacetylene, polyalkylthiophene derivatives, and polysilane derivatives; α-Si, α-SiC; and alloys of alkali metals and alkaline earth metals such as Li, Cs, Ba, Sr, and Ca. Al or Al alloys are highly versatile as electrodes and relatively inexpensive, and thus provide the effect of being capable of suppressing manufacturing costs. These conductive materials may be used alone, or two or more kinds thereof may be used in combination. When two or more kinds are used, layers made from each material may be layered. Note that indium tin oxide (ITO) is more preferably used. Indium tin oxide (ITO) has a record of being used in many displays as a transparent electrode, can be repurposed to a manufacturing apparatus, and thus has the effect of being capable of suppressing manufacturing costs.

As a method of forming the first electrode 6C, the second electrode 6D, the third electrode 6A, and the fourth electrode 6B, a general electrode formation method can be used, and examples thereof include physical vapor deposition (PVD) such as vacuum vapor deposition, a sputtering method, electron beam (EB) vapor deposition, and an ion plating method, or chemical vapor deposition (CVD). Further, the method of patterning these electrodes is not particularly limited as long as the method is capable of precisely forming a desired pattern, and specific examples include a photolithography method and an ink-jet method.

FIG. 9 is a diagram illustrating a schematic configuration of another light-emitting element array 2a that can be provided in the display device according to the first embodiment. Note that FIG. 9 illustrates only one light-emitting element provided on the active matrix substrate 19, which is a portion of the light-emitting element array 2a including a plurality of light-emitting elements.

In the light-emitting element provided in the light-emitting element array 2 illustrated in (a) of FIG. 2, the insulator 22 is separately formed in the first gap formed between the first electrode 6C and the second electrode 6D, the insulator 21 is separately formed in the third gap formed between the electron transport layer (ETL) 15 and the hole transport layer (HTL) 17, and the insulator 20 is separately formed in the fourth gap formed between the hole transport layer (HTL) 14 and the electron transport layer (ETL) 18 as described above.

On the other hand, in the light-emitting element provided in the light-emitting element array 2a illustrated in FIG. 9, an electron transport layer (ETL) 15' is formed after the first electrode 6C and the second electrode 6D including the first gap therebetween are simultaneously or separately formed. The first gap between the first electrode 6C and the second electrode 6D may be filled with the electron transport layer (ETL) 15'. Subsequently, after the electron transport layer (ETL) 15' is formed into the intended shape, the hole transport layer (HTL) 17 is formed. Subsequently, a light-emitting layer 16a is formed. At this time, the third gap formed between the electron transport layer (ETL) 15' and the hole transport layer (HTL) 17 may be filled with the light-emitting layer 16a. Subsequently, the hole transport layer (HTL) 14 and the electron transport layer (ETL) 18 having the fourth gap therebetween are similarly formed on the light-emitting layer 16a in a desired shape. Subsequently, a third electrode 6A' and the fourth electrode 6B are formed. When the third electrode 6A' is formed, the fourth gap formed between the hole transport layer (HTL) 14 and the electron transport layer (ETL) 18 may be filled with the third electrode 6A'.

FIG. 10 is a diagram illustrating a schematic configuration of another light-emitting element array 2b that can be provided in the display device according to the first embodiment. Note that FIG. 10 illustrates only one light-emitting element provided on the active matrix substrate 19, which is a portion of the light-emitting element array 2b including a plurality of light-emitting elements.

In the light-emitting element provided in the light-emitting element array 2b illustrated in FIG. 10, electron transport layers (ETLs) 15a, 15b are formed after the first electrode 6C and the second electrode 6D including the first gap therebetween are simultaneously or separately formed. However, the electron transport layer (ETL) 15a and the electron transport layer (ETL) 15b are formed separated from each other, forming a gap corresponding to the first gap, that is, a gap in contact with the first gap. Then, an insulator 23 is formed in the gap corresponding to the first gap, that is, the gap in contact with the first gap, and in the first gap.

Further, an electron transport layer (ETL) 18a and an electron transport layer (ETL) 18b are formed separated from each other, forming a gap corresponding to the second gap formed between the third electrode 6A and the fourth electrode 6B, that is, a gap in contact with the second gap. Then, an insulator 24 is formed in the gap corresponding to the second gap, that is, the gap in contact with the second gap, and in the second gap.

With a configuration such as described above, when the polarities of the first electrode 6C and the second electrode 6D are opposite polarities or when the polarities of the third electrode 6A and the fourth electrode 6B are opposite polarities, the electrical field in a direction from the positive polarity to the negative polarity in the lateral direction can be blocked by the insulators 23, 24, making it possible to suppress an electrical field disturbance of the first region L1 to the fourth region L4 caused by disturbance of the lateral electrical field, and effectively use the light emission state of each region to the edge of the periphery.

Second Embodiment

Next, a second embodiment according to the disclosure will be described with reference to FIG. 11 to FIG. 16. The light-emitting elements provided in light-emitting element arrays 32, 52 of the present embodiment differ from those of the first embodiment in that the area of the first region L1 and the area of the fourth region L4 differ from each other. Otherwise, the light-emitting elements are as described in the first embodiment. For convenience of description, members having the same functions as those of the members illustrated in the diagrams in the first embodiment are denoted by the same reference numerals, and descriptions thereof will be omitted.

Figure 11:
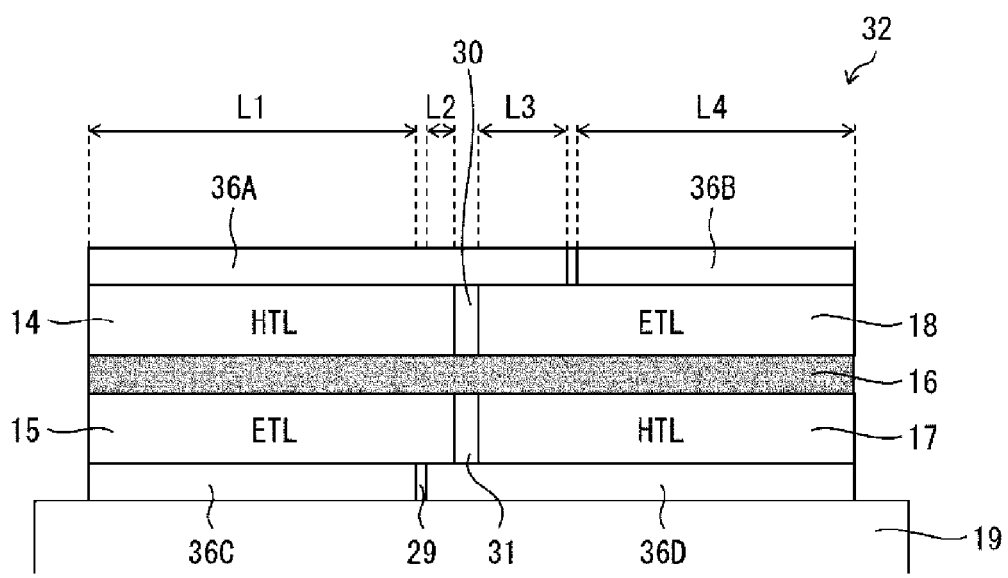
FIG. 11 is a diagram illustrating a schematic configuration of a light-emitting element array provided in a display device according to a second embodiment.

FIG. 11 is a diagram illustrating a schematic configuration of the light-emitting element array 32. Note that FIG. 11 illustrates only one light-emitting element provided on the active matrix substrate 19, which is a portion of the light-emitting element array 32 including a plurality of light-emitting elements.

Figure 12:
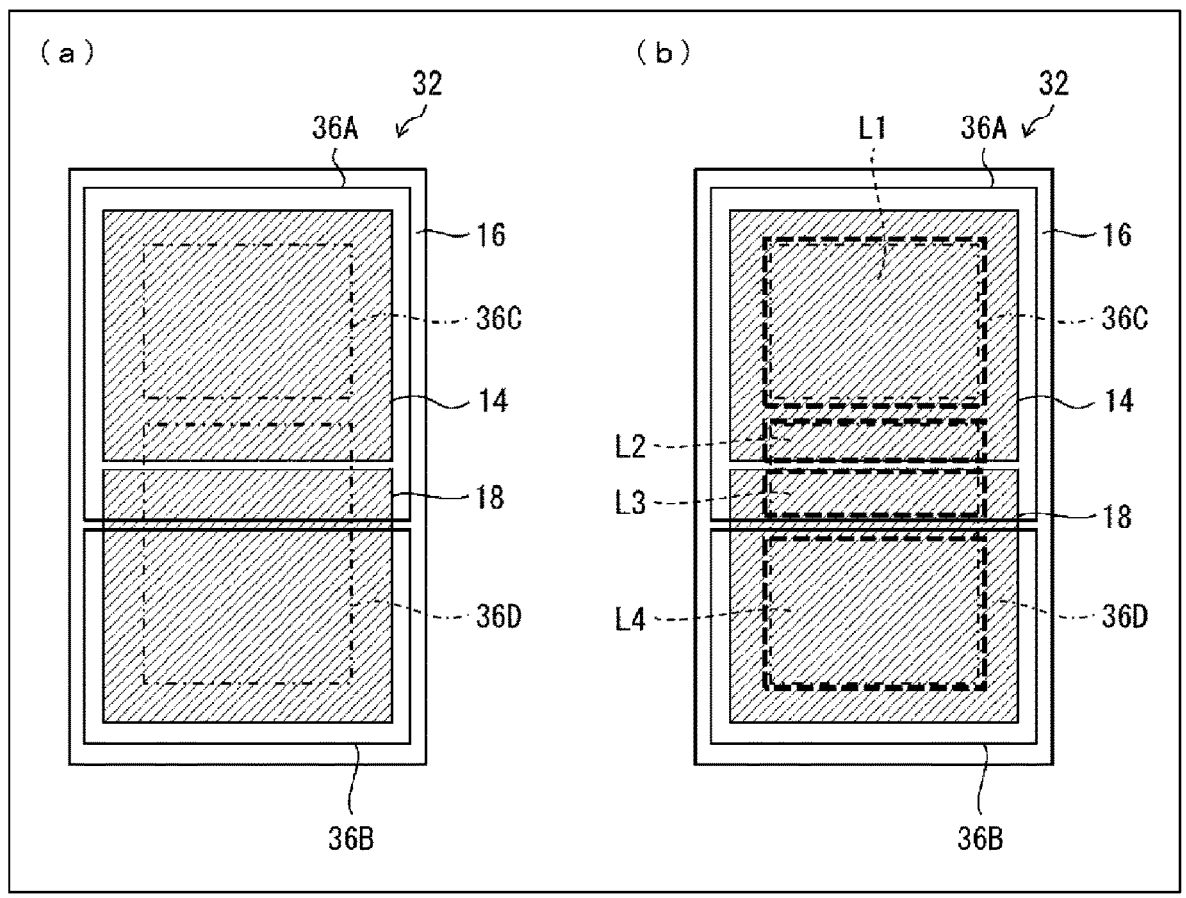
FIG. 12(a) is a top view of the light-emitting element array provided in the display device according to the second embodiment, and (b) is a top view of the light-emitting element array, illustrating the first region to the fourth region.

(a) of FIG. 12 is a top view of the light-emitting element array 32, and (b) of FIG. 12 is a top view of the light-emitting element array 32, illustrating the first region L1 to the fourth region L4.

As illustrated in FIG. 11, a second electrode 36D is formed across the electron transport layer (ETL) 15 and the hole transport layer (HTL) 17, and also formed across the hole transport layer (HTL) 14 and the electron transport layer (ETL) 18. Further, a third electrode 36A is formed across the electron transport layer (ETL) 15 and the hole transport layer (HTL) 17, and also formed across the hole transport layer (HTL) 14 and the electron transport layer (ETL) 18.

Further, as illustrated in FIG. 11, (a) of FIG. 12, and (b) of FIG. 12, an area of the second electrode 36D is larger than an area of a first electrode 36C, and an area of the third electrode 36A is larger than an area of a fourth electrode 36B. Then, a difference between the area of the second electrode 36D and the area of the first electrode 36C is smaller than a difference between the area of the third electrode 36A and the area of the fourth electrode 36B.

Further, in the present embodiment, as illustrated in FIG. 11, (a) of FIG. 12, and (b) of FIG. 12, description is made using as an example a case in which the electron transport layer (ETL) 15 is formed with the same area as that of the hole transport layer (HTL) 17, the hole transport layer (HTL) 14 is formed with the same area as that of the electron transport layer (ETL) 18, the electron transport layer (ETL) 15 has the same area as that of the hole transport layer (HTL) 14, and the hole transport layer (HTL) 17 has the same area as that of the electron transport layer (ETL) 18, but no such limitation is intended. Further, in the light-emitting element provided in the light-emitting element array 32, the area of the first region L1 is larger than the area of the fourth region L4, the area of the fourth region L4 is larger than the area of the third region L3, and the area of the third region L3 is larger than the area of the second region L2.

In the present embodiment, as illustrated in FIG. 11, description is made using as an example a case in which an insulator 29 is formed in the first gap formed between the first electrode 36C and the second electrode 36D, an insulator 31 is formed in the third gap formed between the electron transport layer (ETL) 15 and the hole transport layer (HTL) 17, and an insulator 30 is formed in the fourth gap formed between the hole transport layer (HTL) 14 and the electron transport layer (ETL) 18, but no such limitation is intended, as described above with reference to FIG. 9 and FIG. 10.

Figure 13:
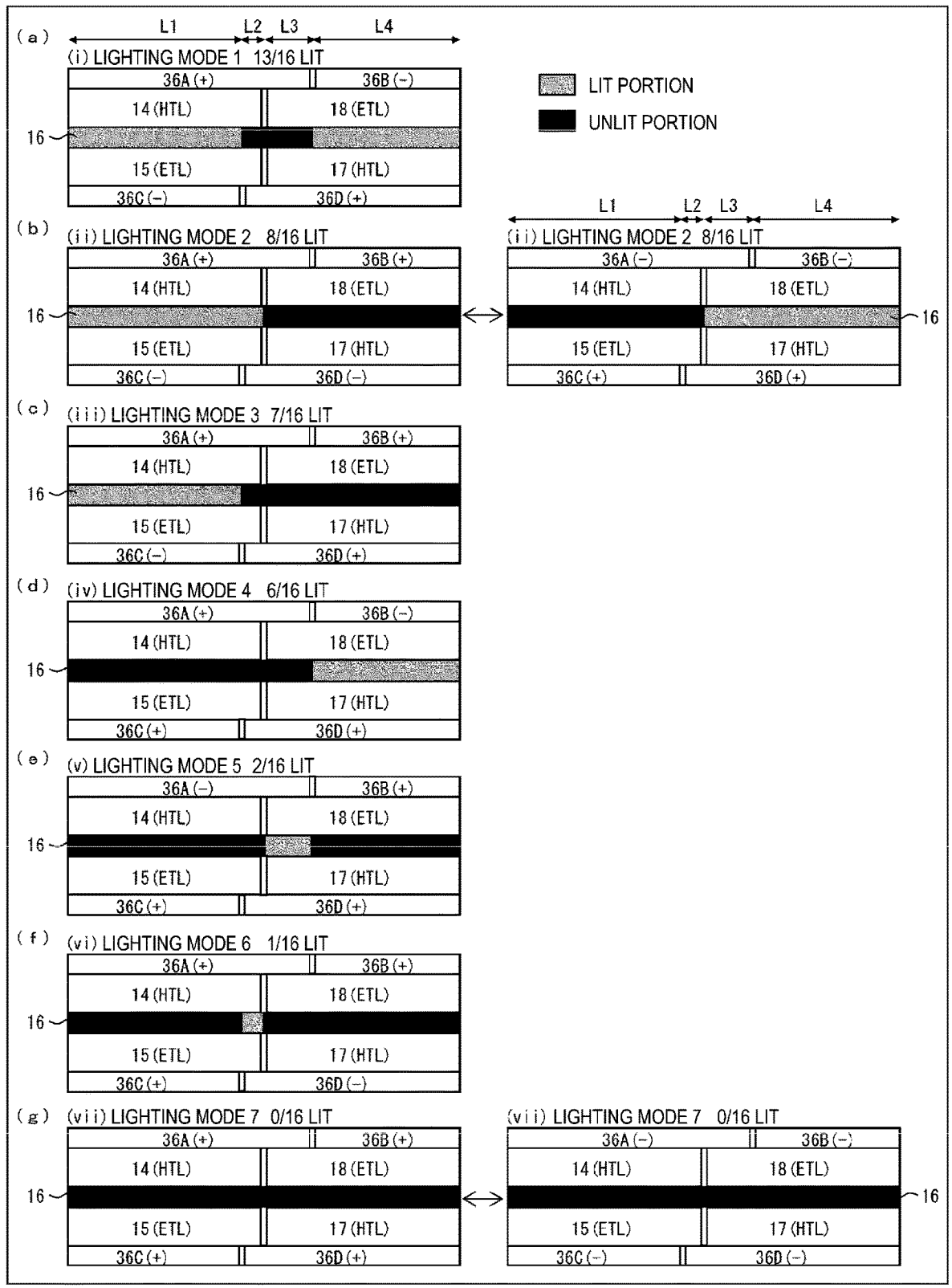
FIGS. 13(a) to (g) are diagrams illustrating polarities of the first electrode, the second electrode, the third electrode, and the fourth electrode, lit portions, and unlit portions in individual lighting modes 1 to 7.

(a) of FIG. 13 to (g) of FIG. 13 are diagrams illustrating polarities of the first electrode 36C, the second electrode 36D, the third electrode 36A, and the fourth electrode 36B, lit portions, and unlit portions in individual lighting modes 1 to 7.

The image timing controller 5 illustrated in FIG. 1 outputs, on the basis of the gray scale value of the input image signal, a lighting mode selection signal for selecting one of the lighting modes 1 to 7 illustrated in (a) of FIG. 13 to (g) of FIG. 13. For example, in a case in which the number of gray scales of the input image signal is 8 bits, the image timing controller 5 outputs a lighting mode selection signal for selecting the lighting mode 1 (13/16 lit) illustrated in (a) of FIG. 13 when the gray scale value of the input image signal is 168 gray scale to 256 gray scale, outputs a lighting mode selection signal for selecting the lighting mode 2 (8/16 lit) illustrated in (b) of FIG. 13 when the gray scale value of the input image signal is 128 gray scale to 167 gray scale, outputs a lighting mode selection signal for selecting the lighting mode 3 (7/16 lit) illustrated in (c) of FIG. 13 when the gray scale value of the input image signal is 96 gray scale to 127 gray scale, outputs a lighting mode selection signal for selecting the lighting mode 4 (6/16 lit) illustrated in (d) of FIG. 13 when the gray scale value of the input image signal is 32 gray scale to 95 gray scale, outputs a lighting mode selection signal for selecting the lighting mode 5 (2/16 lit) illustrated in (e) of FIG. 13 when the gray scale value of the input image signal is 16 gray scale to 31 gray scale, outputs a lighting mode selection signal for selecting the lighting mode 6 (1/16 lit) illustrated in (f) of FIG. 13 when the gray scale value of the input image signal is 2 gray scale to 15 gray scale, and outputs a lighting mode selection signal for selecting the lighting mode 7 (0/16 lit) illustrated in (g) of FIG. 13 when the gray scale value of the input image signal is 1 gray scale.

In a case in which (area of first region (L1))/(area of first region (L1)+area of second region (L2)+area of third region (L3)+area of fourth region (L4))=7/16, (area of fourth region (L4))/(area of first region (L1)+area of second region (L2)+area of third region (L3)+area of fourth region (L4))=6/16, (area of second region (L2))/(area of first region (L1)+area of second region (L2)+area of third region (L3)+area of fourth region (L4))=1/16, and (area of third region (L3))/(area of first region (L1)+area of second region (L2)+area of third region (L3)+area of fourth region (L4))=2/16 as in the present embodiment, regions of the ratios below are lit in the lighting modes 1 to 7 illustrated in (a) of FIG. 13 to (g) of FIG. 13.

In the lighting mode 1 illustrated in (a) of FIG. 13, (area of first region (L1)+area of fourth region (L4))/(area of first region (L1)+area of second region (L2)+area of third region (L3)+area of fourth region (L4))=13/16 are lit. In the lighting mode 2 illustrated in (b) of FIG. 13. (area of first region (L1)+area of second region (L2))/(area of first region (L1)+area of second region (L2)+area of third region (L3)+area of fourth region (L4))=8/16 or (area of third region (L3)+area of fourth region (L4))/(area of first region (L1)+area of second region (L2)+area of third region (L3)+area of fourth region (L4))=8/16 are lit. In the lighting mode 3 illustrated in (c) of FIG. 13, (area of first region (L1))/(area of first region (L1)+area of second region (L2)+area of third region (L3)+area of fourth region (L4))=7/16 are lit. in the lighting mode 4 illustrated in (d) of FIG. 13, (area of fourth region (L4))/(area of first region (L1)+area of second region (L2)+area of third region (L3)+area of fourth region (L4))=6/16 are lit. in the lighting mode 5 illustrated in (e) of FIG. 13, (area of third region (L3))/(area of first region (L1)+area of second region (L2)+area of third region (L3)+area of fourth region (L4))=2/16 are lit. In the lighting mode 6 illustrated in (f) of FIG. 13, (area of second region (L2))/(area of first region (L1)+area of second region (L2)+area of third region (L3)+area of fourth region (L4))=1/16 are lit. In the lighting mode 7 illustrated in (g) of FIG. 13, (0/(area of first region (L1)+area of second region (L2)+area of third region (L3)+area of fourth region (L4))=0/16 are lit.

As illustrated in (b) of FIG. 13, in the case of the lighting mode 2, different regions of the light-emitting layer 16 can be made to emit light in the first lighting period and the second lighting period following the first lighting period, making it possible to prevent a reduction in service life of the light-emitting element.

Further, for example, as illustrated in (b) of FIG. 13 and (g) of FIG. 13, when a voltage of a polarity opposite to that in the first lighting period is applied to each of the first electrode 36C, the second electrode 36D, the third electrode 36A, and the fourth electrode 36B, that is, when alternating current driving is performed in the second lighting period following the first lighting period, a reduction in service life of the light-emitting element can be prevented.

Note that the length of the first lighting period and the length of the second lighting period may be the same or may be different.

(a) of FIG. 14 to (g) of FIG. 14 are tables showing polarities of the first electrode 36C, the second electrode 36D, the third electrode 36A, and the fourth electrode 36B, and orientations of electrical fields and lit/unlit states of the first region L1 to the fourth region L4 in each lighting mode 1 to 7 illustrated in (a) of FIG. 12 to (g) of FIG. 12.

In (a) of FIG. 14 to (g) of FIG. 14, the polarities of the first electrode 36C, the second electrode 36D, the third electrode 36A, and the fourth electrode 36B being positive means that ELVDD is supplied to these electrodes, and the polarities of the first electrode 36C, the second electrode 36D, the third electrode 36A, and the fourth electrode 36B being negative means that ELVSS is supplied to these electrodes. Further, the orientation of the electrical field being downward means that an electrical field is generated in a direction from the upper electrode to the lower electrode in the light-emitting layer 16, and the orientation of the electrical field being upward means that an electrical field is generated in a direction from the lower electrode to the upper electrode in the light-emitting layer 16. The orientation of the electrical field being none means that no electrical field is generated in the light-emitting layer 16, Further, the lit/unlit state being ON means that corresponding regions of the first region L1, the second region L2, the third region L3, and the fourth region L4 are lit, and the lit/unlit state being OFF means that corresponding regions of the first region L1, the second region L2, the third region L3, and the fourth region L4 are not lit.

Figure 15:
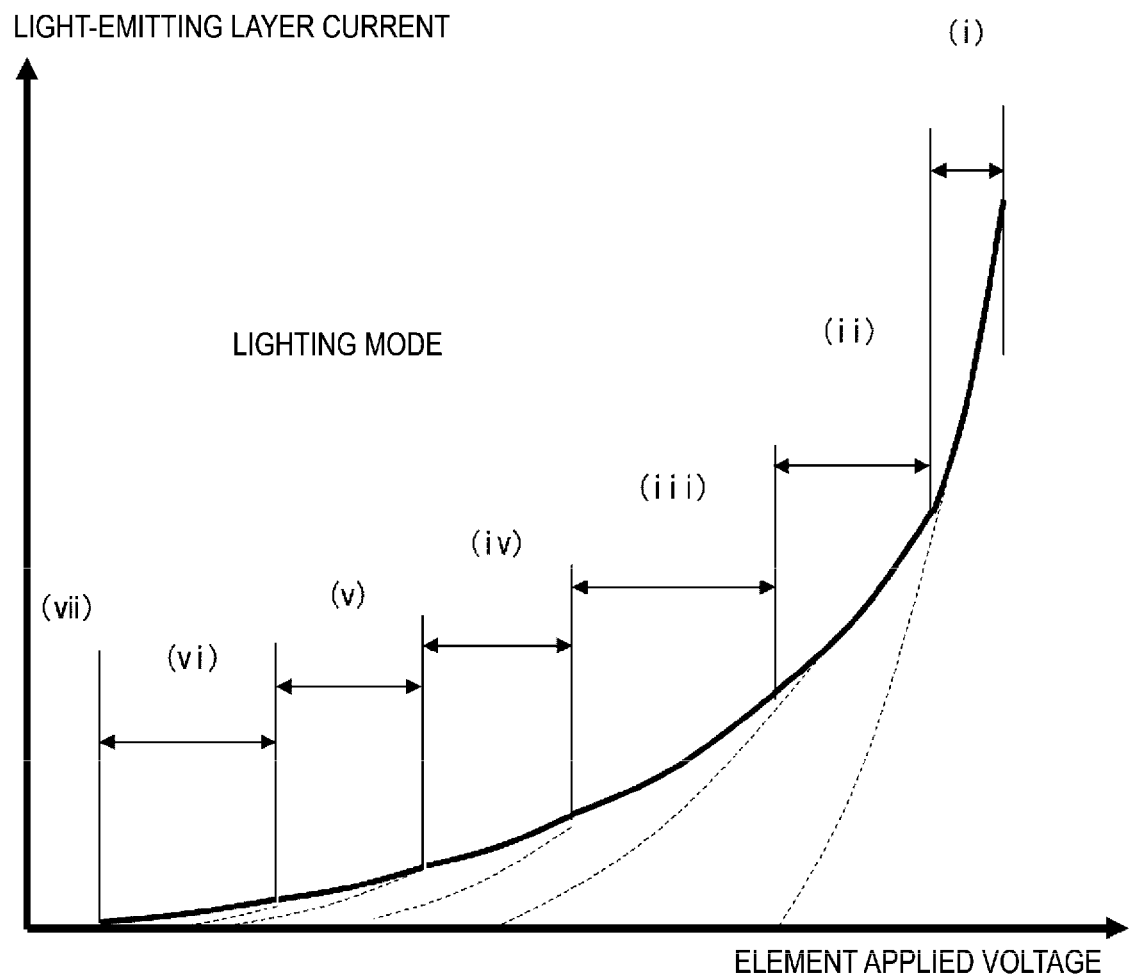
FIG. 15 is a graph showing a relationship between an element-applied voltage and a light-emitting layer current in the light-emitting element provided in the light-emitting element array of the display device according to the second embodiment.

FIG. 15 is a graph showing a relationship between an element-applied voltage and a light-emitting layer current in a light-emitting element provided in the light-emitting element array 32.

As illustrated, in the light-emitting element, stable linear element-applied voltage and light-emitting layer current (brightness) characteristics can be obtained from a low gray scale to a high gray scale, making it possible to realize a display device in which brightness variation in the display surface is suppressed.

As described above, description is made using as an example a case in which, in the light-emitting element provided in the light-emitting element array 32, the area of the first region L1, the area of the second region L2, the area of the third region L3, and the area of the fourth region L4 are different from each other, and the area of the first region L1 is larger than the area of the fourth region L4, but no such limitation is intended and, as described later, the area of the fourth region L4 may be larger than the area of the first region L1.

Figure 16:
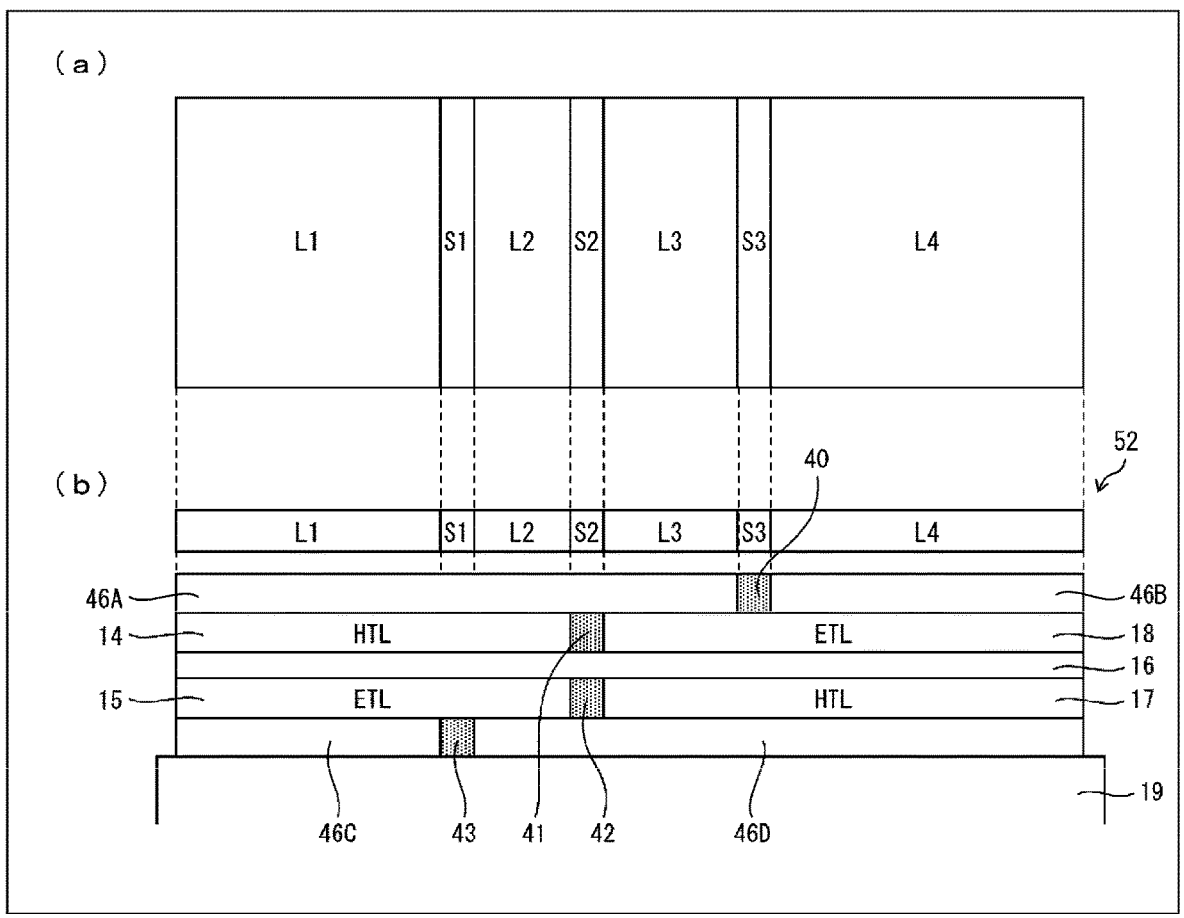
FIG. 16(a) is a top view of a light-emitting element array serving as a modified example that can be provided in the display device according to the second embodiment and illustrates the first region to the fourth region of the light-emitting element array, and (b) is a diagram illustrating a schematic configuration of the light-emitting element array serving as a modified example that can be provided in the display device according to the second embodiment.
Figure 17:
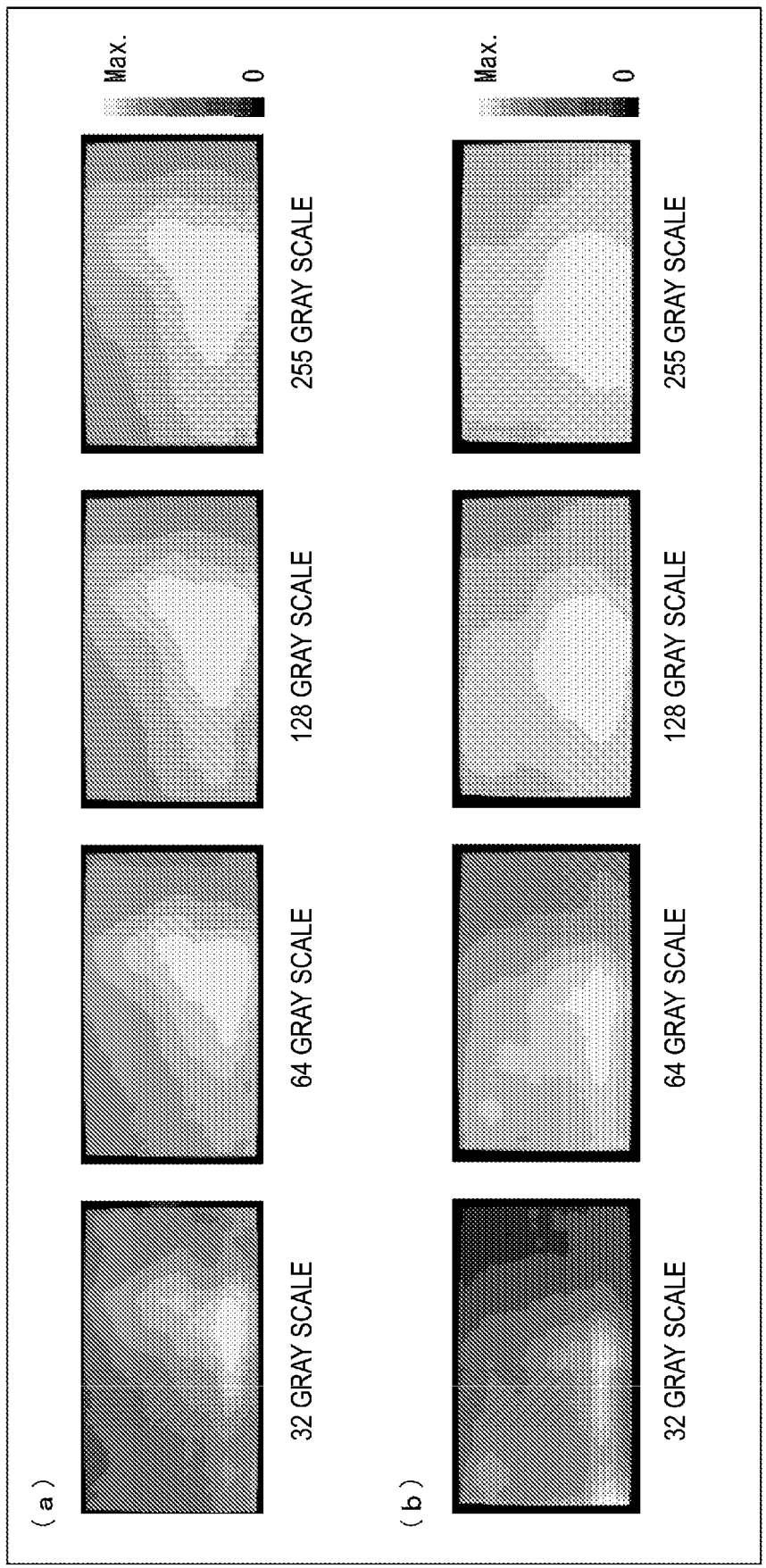
FIGS. 17(a) and (b) are diagrams illustrating a degree of brightness variation in a display surface in each gray scale of a QLED display device in the related art having a time division driving system.

(a) of FIG. 16 is a top view of the light-emitting element array 52 serving as a modified example that can be provided in the display device according to the second embodiment and illustrates the first region L1 to the fourth region L4 of the light-emitting element array 52, and (b) of FIG. 16 is a diagram illustrating a schematic configuration of the light-emitting element array 52 serving as a modified example that can be provided in the display device according to the second embodiment. Note that (b) of FIG. 16 illustrates only one light-emitting element provided on the active matrix substrate 19, which is a portion of the light-emitting element array 52 including a plurality of light-emitting elements.

As illustrated in (a) of FIG. 16, the area of the fourth region L4 is larger than the area of the first region L1, the area of the first region L1 is larger than the area of the third region L3, and the area of the third region L3 is larger than the area of the second region L2.

As illustrated in (b) of FIG. 16, a second electrode 46D is formed across the electron transport layer (ETL) 15 and the hole transport layer (HTL) 17, and also formed across the hole transport layer (HTL) 14 and the electron transport layer (ETL) 18. Further, a third electrode 46A is formed across the electron transport layer (ETL) 15 and the hole transport layer (HTL) 17, and also formed across the hole transport layer (HTL) 14 and the electron transport layer (ETL) 18. An area of the second electrode 46D is larger than an area of a first electrode 46C, and an area of the third electrode 46A is larger than an area of a fourth electrode 46B. Further, a difference between the area of the second electrode 46D and the area of the first electrode 46C is larger than a difference between the area of the third electrode 46A and the area of the fourth electrode 46B.

Further, in the present embodiment, as illustrated in (b) of FIG. 16, description is made using as an example a case in which the electron transport layer (ETL) 15 is formed with the same area as that of the hole transport layer (HTL) 14, the hole transport layer (HTL) 17 is formed with the same area as that of the electron transport layer (ETL) 18, the electron transport layer (ETL) 15 is formed with an area smaller than that of the hole transport layer (HTL) 17, and the hole transport layer (HTL) 14 is formed with an area smaller than that of the electron transport layer (ETL) 18, but no such limitation is intended.

In the present embodiment, as illustrated in (b) of FIG. 16, description is made using as an example a case in which an insulator 43 is formed in the first gap formed between the first electrode 46C and the second electrode 46D, an insulator 42 is formed in the third gap formed between the electron transport layer (ETL) 15 and the hole transport layer (HTL) 17, an insulator 41 is formed in the fourth gap formed between the hole transport layer (HTL) 14 and the electron transport layer (ETL) 18, and an insulator 40 is formed in the second gap formed between the third electrode 46A and the fourth electrode 46B, but no such limitation is intended.

Note that the first gap formed between the first electrode 46C and the second electrode 46D forms a non-light-emitting region S1, the third gap formed between the electron transport layer (ETL) 15 and the hole transport layer (HTL) 17 and the fourth gap formed between the hole transport layer (HTL) 14 and the electron transport layer (ETL) 18 form a non-light-emitting region S2, and the second gap formed between the third electrode 46A and the fourth electrode 46B forms a non-light-emitting region S3.

Supplement

First Aspect

A light-emitting element including:

a light-emitting layer;

an upper electrode provided on a first side of the light-emitting layer; and a lower electrode provided on a second side of the light-emitting layer opposite to the first side, wherein the lower electrode is constituted by a first electrode and a second electrode including a first gap therebetween, the second electrode having an area larger than that of the first electrode, the upper electrode is constituted by a third electrode and a fourth electrode including a second gap therebetween, the third electrode facing the first electrode and the second electrode, the fourth electrode facing the second electrode and having an area smaller than that of the third electrode, a first charge transport layer and a second charge transport layer are provided between the lower electrode and the light-emitting layer, a third charge transport layer facing the first charge transport layer and a fourth charge transport layer facing the second charge transport layer are provided between the upper electrode and the light-emitting layer, a first region where the first electrode and the third electrode overlap includes the first charge transport layer, the light-emitting layer, and the third charge transport layer, a second region being a portion of a region where the second electrode and the third electrode overlap includes the first charge transport layer, the light-emitting layer, and the third charge transport layer, a third region being another portion of the region where the second electrode and the third electrode overlap includes the second charge transport layer, the light-emitting layer, and the fourth charge transport layer, a fourth region where the second electrode and the fourth electrode overlap includes the second charge transport layer, the light-emitting layer, and the fourth charge transport layer, the first charge transport layer and the fourth charge transport layer are transport layers of a first carrier, and the second charge transport layer and the third charge transport layer are transport layers of a second carrier different from the first carrier.

Second Aspect

The light-emitting element according to the first aspect,
wherein the first carrier is a positive hole,
the second carrier is an electron,
the first charge transport layer and the fourth charge transport layer are hole transport layers, and
the second charge transport layer and the third charge transport layer are electron transport layers.

Third Aspect

The light-emitting element according to the first aspect,
wherein the first carrier is an electron,
the second carrier is a positive hole,
the first charge transport layer and the fourth charge transport layer are electron transport layers, and
the second charge transport layer and the third charge transport layer are hole transport layers.

Fourth Aspect

The light-emitting element according to any one of the first to third aspects,
wherein an area in the first region where the first charge transport layer, the light-emitting layer, and the third charge transport layer overlap to form a light-emitting region, and an area in the fourth region where the second charge transport layer, the light-emitting layer, and the fourth charge transport layer overlap to form a light-emitting region are equal.

Fifth Aspect

The light-emitting element according to any one of the first to fourth aspects,
wherein an area in the second region where the first charge transport. layer, the light-emitting layer, and the third charge transport layer overlap to form a light-emitting region, and an area in the third region where the second charge transport layer, the light-emitting layer, and the fourth charge transport layer overlap to form a light-emitting region are equal.

Sixth Aspect

The light-emitting element according to the fourth or fifth aspect,
wherein an area of the light-emitting region in the first region or an area of the light-emitting region in the fourth region is larger than an area of the light-emitting region in the second region or an area of the light-emitting region in the third region.

Seventh Aspect

The light-emitting element according to any one of the first to third aspect, wherein an area in the first region where the first charge transport layer, the light-emitting layer, and the third charge transport layer overlap to form a light-emitting region is larger than an area in the fourth region where the second charge transport layer, the light-emitting layer, and the fourth charge transport layer overlap to form a light-emitting region.

Eighth Aspect

The light-emitting element according to any one of the first to third aspects,
wherein an area in the first region where the first charge transport layer, the light-emitting layer, and the third charge transport layer overlap to form a light-emitting region is smaller than an area in the fourth region where the second charge transport layer, the light-emitting layer, and the fourth charge transport layer overlap to form a light-emitting region.

Ninth Aspect

The light-emitting element according to any one of the first to eighth aspects,
wherein a same material as that of the first charge transport. layer is formed in the first gap between the first electrode and the second electrode.

Tenth Aspect

The light-emitting element according to any one of the first to eighth aspects,
wherein an insulator is formed in the first gap between the first electrode and the second electrode.

Eleventh Aspect

The light-emitting element according to the tenth aspects,
wherein an insulator is formed in the first gap between the first electrode and the second electrode and in a gap in contact with the first gap in the first charge transport layer.

Twelfth Aspect

The light-emitting element according to any one of the first to eleventh aspects,
wherein a third gap is formed between the first charge transport layer and the second charge transport layer, and
a same material as that of the light-emitting layer is formed in the third gap.

Thirteenth Aspect

The light-emitting element according to any one of the first to eleventh aspects,
wherein a third gap is formed between the first charge transport layer and the second charge transport layer, and
an insulator is formed in the third gap.

Fourteenth Aspect

The light-emitting element according to any one of the first to thirteenth aspects,
wherein a fourth gap is formed between the third charge transport layer and the fourth charge transport layer, and
a same material as that of the third electrode is formed in the fourth gap.

Fifteenth Aspect

The light-emitting element according to any one of the first to thirteenth aspects,
wherein a fourth gap is formed between the third charge transport layer and the fourth charge transport layer, and
an insulator is formed in the fourth gap.

Sixteenth Aspect

The light-emitting element according to any one of the first to fifteenth aspects,
wherein an insulator is formed in the second gap between the third electrode and the fourth electrode.

Seventeenth Aspect

The light-emitting element according to the sixteenth aspect, wherein an insulator is formed in the second gap between the third electrode and the fourth electrode and in a gap in contact with the second gap in the fourth charge transport layer.

Eighteenth Aspect

A display device includes:

a light-emitting element array including an active matrix substrate and the light-emitting element according to any one of the first to seventeenth aspects provided on the active matrix substrate; and a circuit configured to output a signal configured to switch each of the first electrode, the second electrode, the third electrode, and the fourth electrode to a cathode electrode or an anode electrode on the basis of a gray scale of an input image signal.

Nineteenth Aspect

The display device according to the eighteenth aspect, wherein the circuit is configured to output a signal configured to cause the first electrode and the fourth electrode to be cathode electrodes and the second electrode and the third electrode to be anode electrodes during a first lighting period.

Twentieth Aspect

The display device according to the eighteenth aspect, wherein the circuit is configured to output a signal configured to cause the first electrode and the second electrode to be cathode electrodes and the third electrode and the fourth electrode to be anode electrodes during a first lighting period.

Twenty-First Aspect

The display device according to the eighteen aspect, wherein the circuit is configured to output a signal configured to cause the first electrode to be a cathode electrode and the second electrode, the third electrode, and the fourth electrode to be anode electrodes during a first lighting period.

Twenty-Second Aspect

The display device according to the twentieth aspect, wherein the circuit is configured to output a signal configured to cause the first electrode and the second electrode to be anode electrodes and the third electrode and the fourth electrode to be cathode electrodes during a second lighting period.

Twenty-Third Aspect

The display device according to the twenty-second aspect, wherein a length of the first lighting period and a length of the second lighting period are the same.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in the embodiments.

INDUSTRIAL APPLICABILITY

The disclosure can be utilized for a light-emitting element and a display device.

The invention claimed is:

1. A light-emitting element comprising:
a light-emitting layer;
an upper electrode provided on a first side of the light-emitting layer; and
a lower electrode provided on a second side of the light-emitting layer opposite the first side,
wherein the lower electrode comprises a first electrode and a second electrode including a first gap between the first electrode and the second electrode, the second electrode having an area larger than an area of the first electrode,
the upper electrode comprises a third electrode and a fourth electrode including a second gap between the third electrode and the fourth electorde, the third electrode facing the first electrode and the second electrode, the fourth electrode facing the second electrode and having an area smaller than an area of the third electrode,
a first charge transport layer and a second charge transport layer are provided between the lower electrode and the light-emitting layer,
a third charge transport layer facing the first charge transport layer and a fourth charge transport layer facing the second charge transport layer are provided between the upper electrode and the light-emitting layer,
a first region, where the first electrode and the third electrode overlap, includes the first charge transport layer, the light-emitting layer, and the third charge transport layer,
a second region, being a portion of a region where the second electrode and the third electrode overlap, includes the first charge transport layer, the light-emitting layer, and the third charge transport layer,
a third region, being another portion of the region where the second electrode and the third electrode overlap, includes the second charge transport layer, the light-emitting layer, and the fourth charge transport layer,
a fourth region, where the second electrode and the fourth electrode overlap, includes the second charge transport layer, the light-emitting layer, and the fourth charge transport layer,
the first charge transport layer and the fourth charge transport layer are transport layers of a first carrier,
the second charge transport layer and the third charge transport layer are transport layers of a second carrier different from the first carrier,
the first carrier is a positive hole,
the second carrier is an electron,
the first charge transport layer and the fourth charge transport layer are hole transport layers, and
the second charge transport layer and the third charge transport layer are electron transport layers.

2. A light-emitting element comprising:
a light-emitting layer;
an upper electrode provided on a first side of the light-emitting layer; and
a lower electrode provided on a second side of the light-emitting layer opposite the first side,
wherein the lower electrode comprises a first electrode and a second electrode including a first gap between the first electrode and the second electrode, the second electrode having an area larger than an area of the first electrode,
the upper electrode comprises a third electrode and a fourth electrode including a second gap between the third electrode and the fourth electorde, the third electrode facing the first electrode and the second electrode, the fourth electrode facing the second electrode and having an area smaller than an area of the third electrode, a first charge transport layer and a second charge transport layer are provided between the lower electrode and the light-emitting layer,
a third charge transport layer facing the first charge transport layer and a fourth charge transport layer facing the second charge transport layer are provided between the upper electrode and the light-emitting layer,
a first region, where the first electrode and the third electrode overlap, includes the first charge transport layer, the light-emitting layer, and the third charge transport layer,
a second region, being a portion of a region where the second electrode and the third electrode overlap, includes the first charge transport layer, the light-emitting layer, and the third charge transport layer,
a third region, being another portion of the region where the second electrode and the third electrode overlap, includes the second charge transport layer, the light-emitting layer, and the fourth charge transport layer,
a fourth region, where the second electrode and the fourth electrode overlap, includes the second charge transport layer, the light-emitting layer, and the fourth charge transport layer,
the first charge transport layer and the fourth charge transport layer are transport layers of a first carrier,
the second charge transport layer and the third charge transport layer are transport layers of a second carrier different from the first carrier,
the first carrier is an electron,
the second carrier is a positive hole,
the first charge transport layer and the fourth charge transport layer are electron transport layers, and
the second charge transport layer and the third charge transport layer are hole transport layers.

3. The light-emitting element according to claim 1, wherein an area in the first region where the first charge transport layer, the light-emitting layer, and the third charge transport layer overlap to form a light-emitting region, and an area in the fourth region where the second charge transport layer, the light-emitting layer, and the fourth charge transport layer overlap to form a light-emitting region are equal.

4. The light-emitting element according to claim 1, wherein an area in the second region where the first charge transport layer, the light-emitting layer, and the third charge transport layer overlap to form a light-emitting region, and an area in the third region where the second charge transport layer, the light-emitting layer, and the fourth charge transport layer overlap to form a light-emitting region are equal.

5. The light-emitting element according to claim 3, wherein an area of the light-emitting region in the first region or an area of the light-emitting region in the fourth region is larger than an area of the light-emitting region in the second region or an area of the light-emitting region in the third region.

6. The light-emitting element according to claim 1, wherein an area in the first region where the first charge transport layer, the light-emitting layer, and the third charge transport layer overlap to form a light-emitting region is larger than an area in the fourth region where the second charge transport layer, the light-emitting layer, and the fourth charge transport layer overlap to form a light-emitting region.

7. The light-emitting element according to claim 1, wherein an area in the first region where the first charge transport layer, the light-emitting layer, and the third charge transport layer overlap to form a light-emitting region is smaller than an area in the fourth region where the second charge transport layer, the light-emitting layer, and the fourth charge transport layer overlap to form a light-emitting region.

8. The light-emitting element according to claim 1, wherein a same material as that of the first charge transport layer is formed in the first gap between the first electrode and the second electrode.

9. The light-emitting element according to claim 1, wherein an insulator is formed in the first gap between the first electrode and the second electrode.

10. The light-emitting element according to claim 9, wherein an insulator is formed in the first gap between the first electrode and the second electrode and in a gap in contact with the first gap in the first charge transport layer.

11. The light-emitting element according to claim 1, wherein a third gap is formed between the first charge transport layer and the second charge transport layer, and
a same material as that of the light-emitting layer is formed in the third gap.

12. The light-emitting element according to claim 1, wherein a third gap is formed between the first charge transport layer and the second charge transport layer, and
an insulator is formed in the third gap.

13. The light-emitting element according to claim 1, wherein a fourth gap is formed between the third charge transport layer and the fourth charge transport layer, and
a same material as that of the third electrode is formed in the fourth gap.

14. The light-emitting element according to claim 1, wherein a fourth gap is formed between the third charge transport layer and the fourth charge transport layer, and
an insulator is formed in the fourth gap.

15. The light-emitting element according to claim 1, wherein an insulator is formed in the second gap between the third electrode and the fourth electrode.

16. The light-emitting element according to claim 15, wherein an insulator is formed in the second gap between the third electrode and the fourth electrode and in a gap in contact with the second gap in the fourth charge transport layer.

17. The light-emitting element according to claim 2, wherein an area in the first region where the first charge transport layer, the light-emitting layer, and the third charge transport layer overlap to form a light-emitting region, and an area in the fourth region where the second charge transport layer, the light-emitting layer, and the fourth charge transport layer overlap to form a light-emitting region are equal.

18. The light-emitting element according to claim 2, wherein an area in the second region where the first charge transport layer, the light-emitting layer, and the third charge transport layer overlap to form a light-emitting region, and an area in the third region where the second charge transport layer, the light-emitting layer, and the fourth charge transport layer overlap to form a light-emitting region are equal.

19. The light-emitting element according to claim 17,
wherein an area of the light-emitting region in the first region or an area of the light-emitting region in the fourth region is larger than an area of the light-emitting region in the second region or an area of the light-emitting region in the third region.

20. The light-emitting element according to claim 2,
wherein an insulator is formed in the first gap between the first electrode and the second electrode.

21. The light-emitting element according to claim 2,
wherein a third gap is formed between the first charge transport layer and the second charge transport layer, and an insulator is formed in the third gap.

22. The light-emitting element according to claim 2,
wherein a fourth gap is formed between the third charge transport layer and the fourth charge transport layer, and an insulator is formed in the fourth gap.

* * * * *